United States Patent
Sarrigeorgidis et al.

(10) Patent No.: US 8,265,207 B1
(45) Date of Patent: Sep. 11, 2012

(54) METHODS AND APPARATUS FOR PROVIDING A ML DECODING PIPELINE FOR QPSK MIMO OFDM RECEIVERS

(75) Inventors: Konstantinos Sarrigeorgidis, Sunnyvale, CA (US); Yanni Chen, Sunnyvale, CA (US); Leilei Song, Sunnyvale, CA (US); Kedar Shirali, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/333,106

(22) Filed: Dec. 21, 2011

(51) Int. Cl.
*H04L 27/06* (2006.01)
*H03M 13/03* (2006.01)

(52) U.S. Cl. ........................ 375/341; 714/794

(58) Field of Classification Search .......... 375/259–260, 375/262, 267–269, 316, 322, 329, 341; 370/281, 370/296, 302, 481; 714/752, 786, 794–795, 714/E11.057
See application file for complete search history.

(56) References Cited

U.S. PATENT DOCUMENTS

| | | | |
|---|---|---|---|
| 6,484,285 B1 | 11/2002 | Dent | |
| 6,760,879 B2 | 7/2004 | Giese et al. | |
| 6,856,657 B1 | 2/2005 | Classon et al. | |
| 7,023,934 B2 | 4/2006 | Tran et al. | |
| 7,089,481 B2 | 8/2006 | D'Arcy et al. | |
| 7,373,582 B2 | 5/2008 | Park et al. | |
| 7,489,744 B2 | 2/2009 | Sindhushayana et al. | |
| 7,570,695 B2 | 8/2009 | Maltsev et al. | |
| 7,602,863 B2 | 10/2009 | Kovintavewat et al. | |
| 2010/0070819 A1 | 3/2010 | Stein et al. | |
| 2011/0066913 A1 | 3/2011 | Kang et al. | |

OTHER PUBLICATIONS

Li et al., A Pipeline Sliding Window Max-Log-Map Turbo Decoder, 2007, High Density Packing and Microsystem Integration, 2007. HDP '07. International Symposium on, pp. 1-4.*

* cited by examiner

*Primary Examiner* — Lawrence B Williams

(57) ABSTRACT

Methods and apparatus are provided for computing reliability values in a pipeline. A reliability value portion is computed, with control circuitry in a first pipeline stage, based on a difference between a received input signal value and an expected value. The reliability value portion is combined, in a second pipeline stage that follows the first pipeline stage, with a first value derived from the received input signal to generate a first reliability value. A determination is made as to whether to update the first reliability value in a third pipeline stage based on a combination of the first reliability value with a second reliability value that corresponds to a second value derived from the received input signal.

20 Claims, 20 Drawing Sheets

| Time: 1 | Time: 2 | Time: 3 | Time: 4 | Time: 5 | Time: 6 | 7 | 8 | 9 | 10 | 11 |
|---|---|---|---|---|---|---|---|---|---|---|
| E | C | A | Z1 −A=U1 | \|U1,1\| \|U1,2\| \|U1,3\| | \|U1,1\| + \|U1,2\|+ \|U1,3\| =M1 | Min Tree Level 1 | Min Tree Level 2 | Min Tree Level 3 | Min Tree Level 4 | LLR |
|  | D | B | Z1 −B=U2 | \|U2,1\| \|U2,2\| \|U2,3\| | \|U2,1\| +\|U2,2\|+ \|U2,3\| =M2 |  |  |  |  |  |
|  | Y−E=z | z−C = Z1 | Z1 +A=U3 | \|U3,1\| \|U3,2\| \|U3,3\| | \|U3,1\| +\|U3,2\| +\|U3,3\| =M3 |  |  |  |  |  |
|  |  | z−D = Z2 | Z1 +B=U4 | \|U4,1\| \|U4,2\| \|U4,3\| | \|U4,1\| +\|U4,2\| +\|U4,3\| =M4 |  |  |  |  |  |
|  |  | z+C = Z3 | Z2 −A=U5 | \|U5,1\| \|U5,2\| \|U5,3\| | \|U5,1\| +\|U5,2\| +\|U5,3\| =M5 |  |  |  |  |  |
|  |  | z+D= Z4 | Z2 −B=U6 | \|U6,1\| \|U6,2\| \|U6,3\| | \|U6,1\| +\|U6,2\|+ \|U6,3\| =M6 |  |  |  |  |  |
|  |  |  | Z2 +A=U7 | \|U7,1\| \|U7,2\| \|U7,3\| | \|U7,1\| +\|U7,2\| +\|U7,3\| =M7 |  |  |  |  |  |
|  |  |  | Z2 +B=U8 | \|U8,1\| \|U8,2\| \|U8,3\| | \|U8,1\| +\|U8,2\| +\|U8,3\| =M8 |  |  |  |  |  |
|  |  |  | Z3 −A=U9 | \|U9,1\| \|U9,2\| \|U9,3\| | \|U9,1\| +\|U9,2\| +\|U9,3\| =M9 |  |  |  |  |  |
|  |  |  | Z3 −B=U10 | \|U10,1\| \|U10,2\| \|U10,3\| | \|U10,1\| + \|U10,2\| +\|U10,3\| =M10 |  |  |  |  |  |
|  |  |  | Z3 +A=U11 | \|U11,1\| \|U11,2\| \|U11,3\| | \|U11,1\| + \|U11,2\| +\|U11,3\| =M11 |  |  |  |  |  |
|  |  |  | Z3 +B=U12 | \|U12,1\| \|U12,2\| \|U12,3\| | \|U12,1\| + \|U12,2\| +\|U12,3\| =M12 |  |  |  |  |  |
|  |  |  | Z4 −A=U13 | \|U13,1\| \|U13,2\| \|U13,3\| | \|U13,1\| + \|U13,2\| +\|U13,3\| =M13 |  |  |  |  |  |
|  |  |  | Z4 −B=U14 | \|U14,1\| \|U14,2\| \|U14,3\| | \|U14,1\| + \|U14,2\| +\|U14,3\| =M14 |  |  |  |  |  |
|  |  |  | Z4 +A=U15 | \|U15,1\| \|U15,2\| \|U15,3\| | \|U15,1\| + \|U15,2\| +\|U15,3\| =M15 |  |  |  |  |  |
|  |  |  | Z4 +B=U16 | \|U16,1\| \|U16,2\| \|U16,3\| | \|U16,1\| + \|U16,2\| +\|U16,3\| =M16 |  |  |  |  |  |

METHODS AND APPARATUS FOR PROVIDING A ML DECODING PIPELINE FOR QPSK MIMO OFDM RECEIVERS

CROSS REFERENCE TO RELATED APPLICATIONS

This application claims the benefit of U.S. patent application Ser. No. 12/140,022, filed Jun. 16, 2008, now U.S. Pat. No. 8,098,774 B1; and U.S. Provisional Application Nos. 60/944,245, filed Jun. 15, 2007 and 60/975,639, filed Sep. 27, 2007, each of which is hereby incorporated by reference herein in its entirety.

BACKGROUND OF THE INVENTION

The present invention is directed to methods and apparatus for providing a Maximum Likelihood (ML) decoding pipeline for Quadrature Phase-Shift Keying (QPSK) Multiple-Input-Multiple-Output (MIMO) Orthogonal Frequency-Division Multiplexing (OFDM) receivers, and more particularly to pipelining Log-Likelihood Ratio (LLR) computations associated with multiple stream input signals to increase data throughput.

Typically, in QPSK MIMO OFDM receivers, certainty of the received signal values (i.e., LLR) can be computed using the communications model $y_k = H_k * x_k + n$, where $y_k$ is the received vector at a tone k, $x_k$ is the transmitted vector at the tone k and $H_k$ is the channel response. In particular, the LLR values can be determined from a soft metric (SM) defined for each bit position ($SM_b$, where b is the bit position) as the absolute value of the difference between the value at the bit position of the received signal y and the value at the bit position of the possibly transmitted signal x multiplied by the channel response H (i.e., $SM_b = |Y_b - x_b * H_b|$). The LLR for a particular bit position can then be determined by computing the difference between minimum SM values (minSM) corresponding to each of the possibly transmitted values of that bit position (e.g., ($minSM_0$ for bit position 0 having a value of 0) minus ($minSM_0$ for bit position 0 having a value of 1)). The LLR values thus indicate a confidence level in the received bit value at the particular bit position of a received vector y.

LLR computations generally consume a large amount of processing power and take a long period of time for multiple stream input signals. This is because computing a LLR for a particular bit position b of a received signal requires the system to find, for every stream, the minimum value of the difference between the received signal value at the bit position and every possible permutation of values which that bit position could have been (i.e., the minimum SMO. That is, the system has to guess what the signal x was by trying every combination in comparison to the actually received signal y. The lowest metric value indicates the greatest likelihood that the value of the bit position is the value of the particular permutation of the x vector which led to that lowest metric value (i.e., the smallest difference between the guessed value x and the received value y). This determination must be made for every bit position of every stream of the received signal and is computationally intensive.

Additionally, in a QPSK 3×Nr receiver, every signal stream of a three stream vector contains at least two bit positions which can take on one of four values {(0,0), (0,1), (1,0), (1,1)} which correspond to the complex vector values {1+j, 1−j, −1+j, −1−j}. Thus, in such a receiver, 64 metrics or $SM_b$ values need to be computed for each tone of a received signal to find the LLR for every bit position of the three streams. Therefore, because the system has to compute every permutation of a transmitted signal in comparison to the received signal streams, the complexity of finding LLR values increases exponentially with the number of streams used to transmit a signal.

Accordingly, more efficient computations of LLR values become critical as the number of streams increases and faster computation of those values are necessary for high speed receivers.

SUMMARY OF THE INVENTION

In accordance with the principles of the present invention, methods and apparatus provide a decoding pipeline for QPSK MIMO OFDM receivers. In particular, the LLR value computations are pipelined to increase the number of LLR values that are computed per clock cycle.

In one embodiment, portions of the metric SM that are associated with each of the received signal streams are computed in parallel in a first part of the pipeline. For example, the received signal may be a three stream signal y. The portions that are computed correspond to the subtraction of the received signal y and every permutation of two of the three streams $x_1$, $x_2$, and $x_3$. For example, the portions of SM may be computed in accordance with $y - h_2 * x_2 - h_3 * x_3$ for every stream of the received signal y in parallel, where $h_i$ is a subset corresponding to a particular stream i of the channel response H.

In a second part of the pipeline, the computed metric portions are subtracted from a different permutation of $h_1 * x_2$ every clock cycle to compute the metric. Thus, after four clock cycles, for a QPSK signal having four possible values, the computation of every permutation of $u = y - h_1 * x_1 - h_2 * x_2 - h_3 * x_3$ is completed. After each one of the clock cycles where a metric u is produced for one permutation of $x_1$ (e.g., after $y - h_1 * x_1 - h_2 * x_2 - h_3 * x_3$ has been computed for one permutation of $x_1$), the absolute value of the metric is taken and the metrics that correspond to a particular signal stream are accumulated to produce metric M values which are later used to compute the soft metric and LLR values. In particular, for each permutation of $x_1$ there may be 16 M values produced. Thus, after four clock cycles 64 M values may be produced that correspond to every permutation of $x_1$, $x_2$, and $x_3$ in u.

In a third part of the pipeline, a minimum value of the M values that affect a particular state of a received stream (i.e., a value of one of the bit positions of one of the received streams) is determined. The state associated with that bit position is then set to that minimum M value. At each clock cycle a new minimum value is computed and compared with a previously stored minimum value for that state. This is because the minimum values are computed beginning with the first 16 M values that are associated with one permutation of $x_1$. Accordingly, it is necessary to compare the minimum M values from one permutation of $x_1$ with the minimum M values that result from another permutation of $x_1$.

In the final state of the pipeline, the LLR value is computed for each bit position of the received signal y. The LLR is computed by taking the difference between each of the minimum M values that correspond to a particular bit position of a stream of the received signal y.

In another embodiment, portions of the metric SM that are associated with each one of the received signal streams are computed one stream per clock cycle in a first part of the pipeline. In particular, the first part of the pipeline computes $y - h_0 * x_0 - h_1 * x_1$ for every permutation of $x_0$ and $x_1$ one signal stream per clock cycle. The first part also computes every permutation of $h_2^*x_2$ to be combined with $y-h_0^*x_0-h_1^*x_1$ in subsequent parts of the pipeline.

In the next part of the pipeline, the M values are computed for each permutation of $x_2$ by subtracting the parts computed in the first part of the pipeline and computing the absolute value. In particular, 16 M values are computed for each permutation of $x_2$ associated with one stream of the received signal y in each clock cycle. Thus, after three clock cycles for a three stream input signal, all of the M values for each of the received signal streams are computed.

The minimum of the computed M values is determined simultaneously with each of the M values associated with a particular stream of the received signal at the next part of the pipeline. The state values are set to be the minimum of the computed M values that affect a particular state. The minimum M values that affect a particular state and that are associated with different permutations of $x_2$ are compared to find the minimum among those M values and the state values are set to be that minimum value.

At the final part of the pipeline, the state values that correspond to a particular bit position of each stream of the received signal are combined to compute the LLR value for that bit position. In particular, the LLR value is computed by taking the difference between two state values that correspond to each bit position of a received signal stream.

BRIEF DESCRIPTION OF THE DRAWINGS

The above and other features of the present invention, its nature and various advantages will be more apparent upon consideration of the following detailed description, taken in conjunction with the accompanying drawings in which:

FIG. 11 is a detailed illustration of LLR computation pipeline stages in accordance with an embodiment of the present invention;

DETAILED DESCRIPTION

This invention generally relates to decoding a multi-stream signal that is received in parallel and obtaining LLR values for bit positions in the signal in pipeline stages. For illustrative purposes, this invention will be described in the realm of a 3×Nr MIMO system and in particular decoding a complex QPSK signal that is received in three streams.

Figure 1:
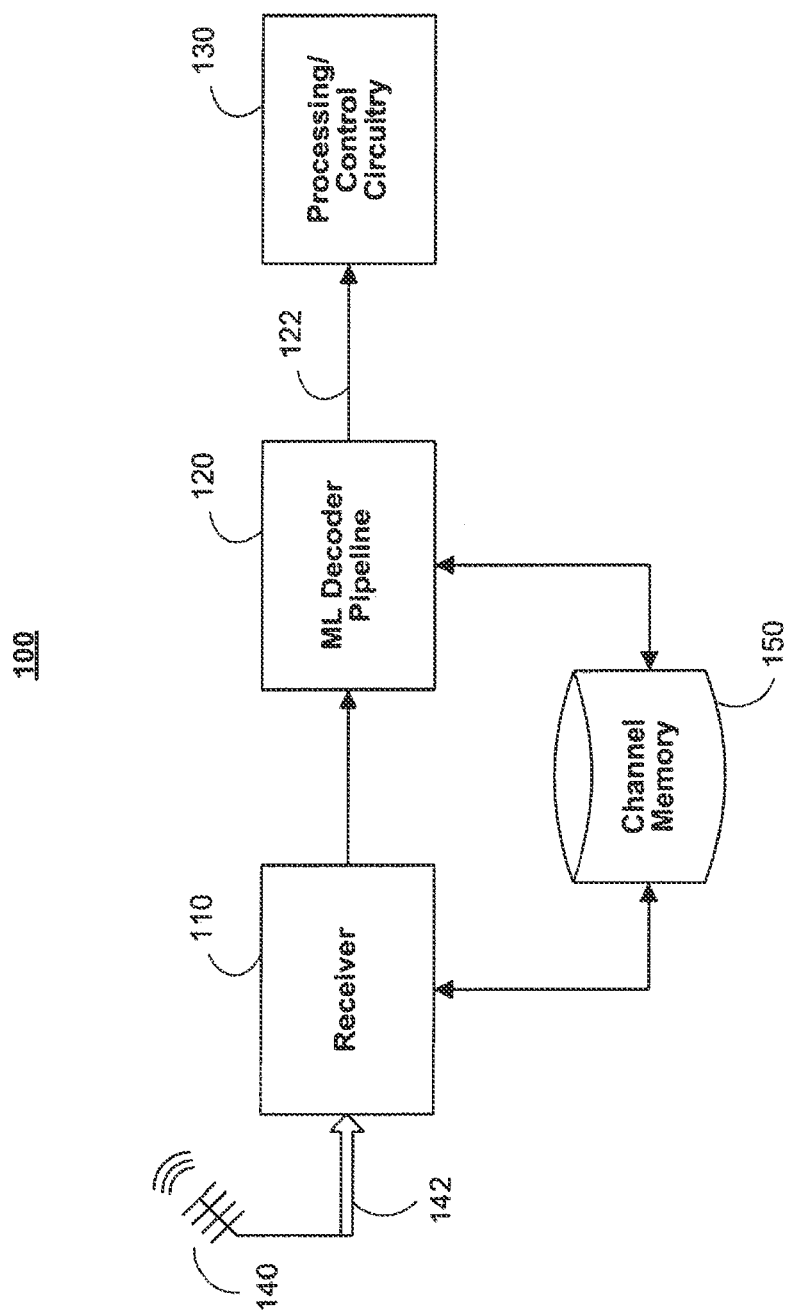
FIG. 1 is a diagram of an illustrative ML decoding pipeline receiver system in accordance with an embodiment of the present invention.

FIG. 1 is a diagram of an illustrative ML decoding pipeline receiver system 100 in accordance with an embodiment of the present invention. System 100 includes a receiver 110, an ML decoder pipeline 120, processing circuitry 130 and a channel memory 150. Receiver 110 is coupled through a communications medium 142 to an antenna 140 or some other signal receiving device (e.g., a cable, infrared, etc.).

Receiver 110 may perform some computations to determine or estimate the channel response H of the transmission medium of antenna 140. Receiver 110 may store the channel response H to channel memory 150 in order to be used in performing LLR computations for verifying the received signal values. Receiver 110 also receives the signal y through communications medium 142. Receiver 110 may store the received signal y to channel memory 150 to allow ML decoder 120 to perform LLR computations on the signal y.

Signal y may be received as any number of parallel streams $y_i$ where i represents the stream of the received signal. For illustrative purposes, the present invention will be described in the context of a complex signal y that is received as three parallel streams $y_1$, $y_2$, $y_3$.

ML decoder pipeline 120 may receive the channel response H and received signal y directly from receiver 110. Alternatively, ML decoder pipeline 120 may retrieve the channel response H and received signal y from channel memory 150. ML decoder pipeline 120 performs pipelined computations using the channel response H and the signal y to determine LLR values for each bit position of the signal y. In particular, ML decoder pipeline 120 can compute 64 metrics for each tone of the received signal in a pipeline fashion. More specifically, ML decoder pipeline 120 computes some of the metrics based on one permutation of one of the signal streams (e.g., $x_1$) and every permutation of the other signal streams (e.g., $x_2$, $x_3$) in some pipeline stages while at the same time in other pipeline stages computing some of the metrics based on a different permutation of stream $x_1$. For example, this may done until all permutations of the three streams have been used to compute the 64 metrics. The metrics are then compared in parts to find the minimum metric values in different pipeline stages and LLR values are then computed in later pipeline stages. Pipelining the metric computations increases the speed and efficiency of the LLR computations since multiple metric computations can be performed simultaneously (i.e., in different pipeline stages). This also allows the system to compute LLR values for one tone of the received signal at the same time the system computes LLR values for another tone of the received signal.

Figure 12:
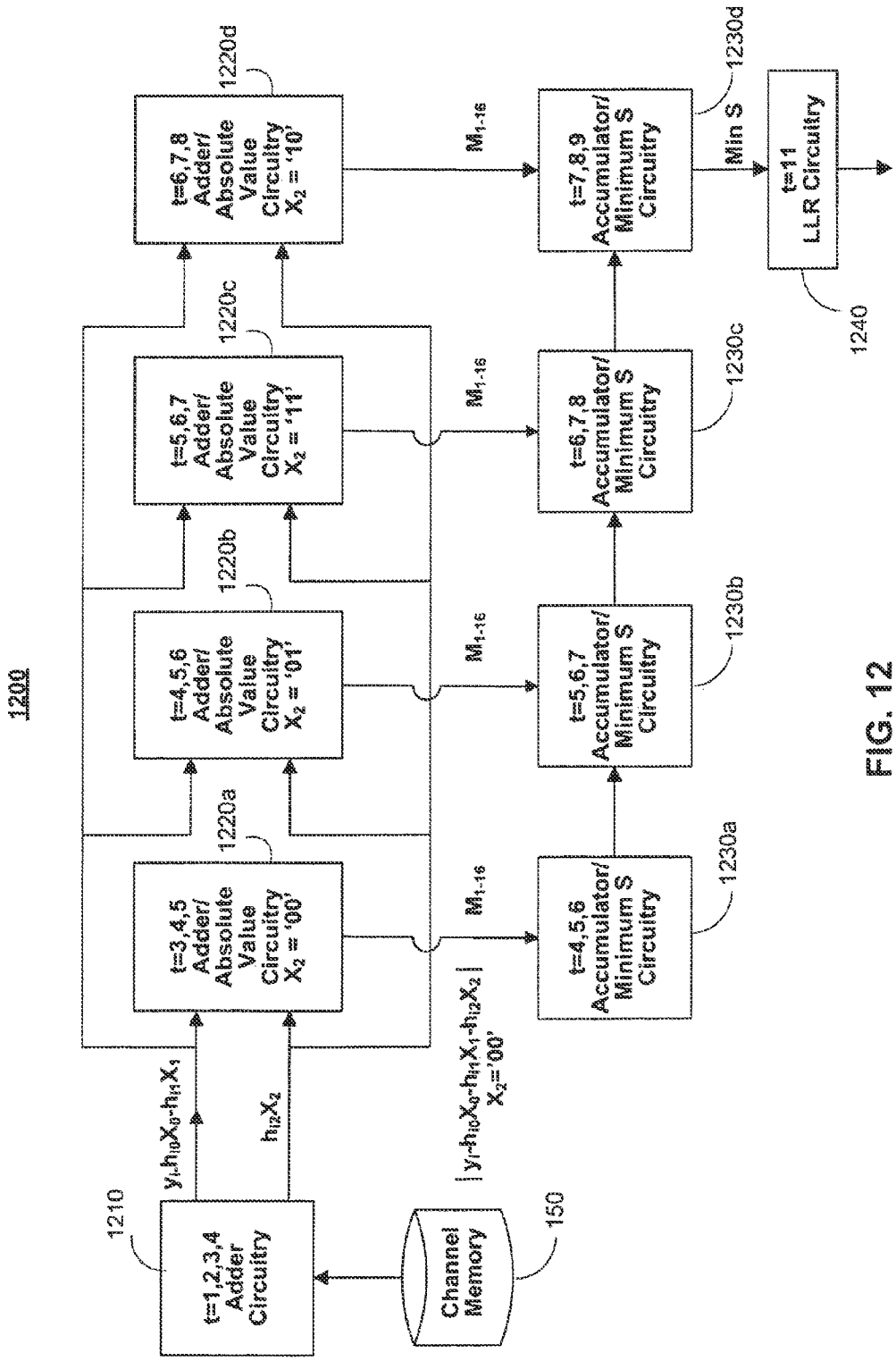
FIG. 12 is a detailed illustration of an ML decoding pipeline in accordance with another embodiment of the present invention.

One implementation of ML decoder pipeline 120 will be provided in more detail in connection with FIGS. 4-11, and another implementation of ML decoder pipeline 120 will be provided in connection with FIG. 12.

ML decoder pipeline 120 uses the computed LLR values to verify or determine the maximum likelihood that a value in a particular bit position of the received signal is correct. ML decoder pipeline 120 outputs the ML values or LLR values of the received signal via communications link 122 to processing circuitry 130 for further computations. Processing circuitry 130 may perform computations on the received signal values such as forward error correction decoding, data manipulations, etc.

Figure 2:
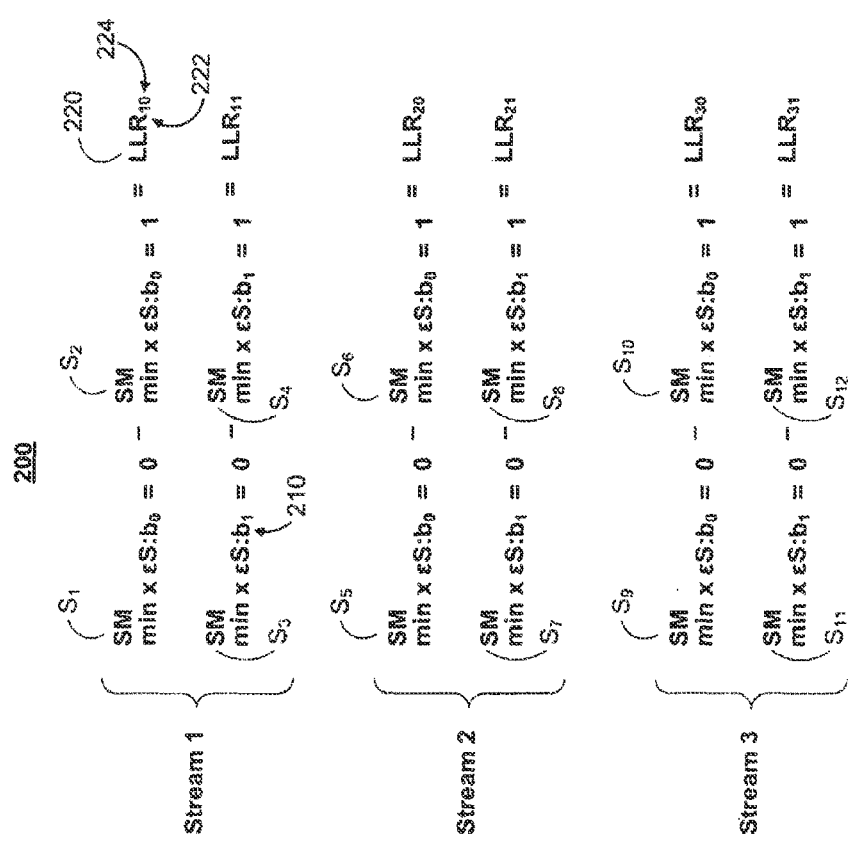
FIG. 2 is an illustrative LLR computations model in accordance with an embodiment of the present invention.

FIG. 2 is an illustrative LLR computations model 200 in accordance with an embodiment of the present invention. LLR computations model 200 includes three streams. Each stream has first and second bit positions that can each take on one of two values. Thus, as shown, stream 1 has four metric states (S1-S4) where S1 and S2 are the metric states that correspond to the values which the first bit of stream 1 can be (i.e., '0' or '1') and S3 and S4 are the metric states that correspond to the values which the second bit of stream 1 can be (i.e., '0' or '1'). In particular, identifier 210 indicates the bit position of the stream that is associated with the metric state and the value with which that bit position is associated. In order to compute all of the LLR values 220 for each stream, it is necessary to compute 12 metric state values S1-S12. Each metric state value is computed by finding the minimum SM values that are associated with a particular bit position value.

To compute the LLR 220 for the first bit of stream 1, for example, the S1 metric state value is subtracted from the S2 metric state value. Accordingly, a more negative LLR value will indicate that the value of the first bit position of stream 1 is more likely to be '0' whereas a more positive LLR value will indicate that the value of the first bit position of stream 1 is more likely to be '1'. Since 12 metric state values are computed, six LLR values 220 are produced each indicating the level of confidence that a particular bit position of one of the streams is a certain value. Identifier 222 of LLR value 220 indicates the stream associated with the LLR value and the identifier 224 indicates the bit position to which the LLR value corresponds.

Figure 3:
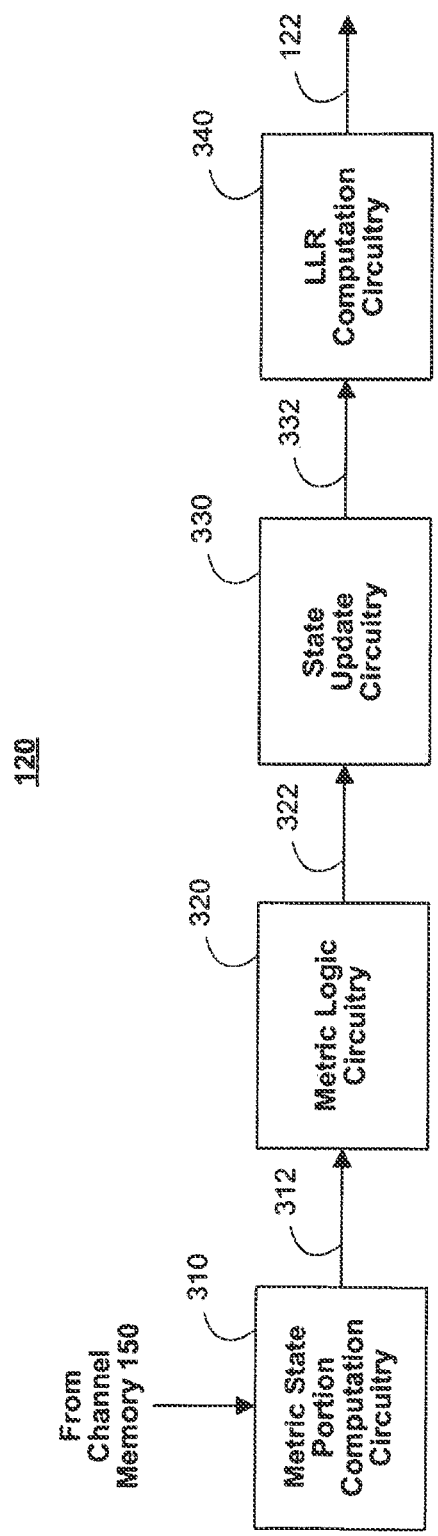
FIG. 3 is a detailed illustration of an ML decoding pipeline in accordance with an embodiment of the present invention.

FIG. 3 is a detailed illustration of an ML decoding pipeline 120 in accordance with an embodiment of the present invention. ML decoding pipeline 120 includes metric state portion computation circuitry 310, metric logic circuitry 320, state update circuitry 330 and LLR computation circuitry 340.

Metric state portion computation circuitry 310 receives the channel response and the received signal streams and computes a portion of the metric SM. For example, in one embodiment, metric state portion computation circuitry 310 computes the portion of SM in accordance with $u=y-(h_1x_1+h_2x_2+h_3x_3)$ for every permutation of $x_2$ and $x_3$ and a first permutation of $x_1$ in a first four clock cycles for the three y streams in parallel. During those first four clock cycles, metric state portion computation circuitry 310 also simultaneously computes u for every permutation of $x_2$ and $x_3$ and a second permutation of $x_1$—hence the pipeline. Because an input stream can take on one of four values, there need to be four permutation computations of $x_1$ in u. This embodiment of metric state portion computation circuitry 310 will be discussed in more detail in connection with FIGS. 4 and 5.

In another embodiment, the portions of u that metric state portion circuitry 310 computes are $h_1*x_1$, $h_2*x_2$ and $h_3*x_3$ and $(y-h_1*x_1-h_2*x_2)$ for every permutation of $x_1$, $x_2$ and $x_3$ for one of the received streams in four clock cycles and computes the metric state portions of different streams of y during the four clock cycles. This embodiment of metric state portion computation circuitry 310 will be discussed in more detail in connection with FIG. 12.

Metric state portion circuitry 310 provides the metric state portions to metric logic circuitry 320 via communications link 312. Metric logic circuitry 320, in one embodiment, computes the metric M values for each permutation of $x_1$ from the received u values in accordance with $M=|u_i|$ where i is the permutation of $x_3$. In some implementations, M may be computed as an approximation in accordance with $|u_i|=\max(|u_{i,I}|, |u_{i,Q}|)+(5/16)*\min(|u_{i,I}|,|u_{i,Q}|)$ where i is the permutation of $x_3$, I is the real component of the u values and Q is the imaginary component of the u values. Thus, in four clock cycles all of the M values of the three streams can be computed where in each clock cycle $M_{1-16}$ are computed which are 16 of the 64 necessary metric state values. In another embodiment, metric logic circuitry 320 computes the $|u_i|$ from $(y-h_1*x_1-h_2*x_2)-h_3x_3$ for each permutation of $x_3$ once every clock cycle. Metric logic circuitry 320 will be discussed in more detail in connection with FIGS. 6 and 12.

Figure 4:
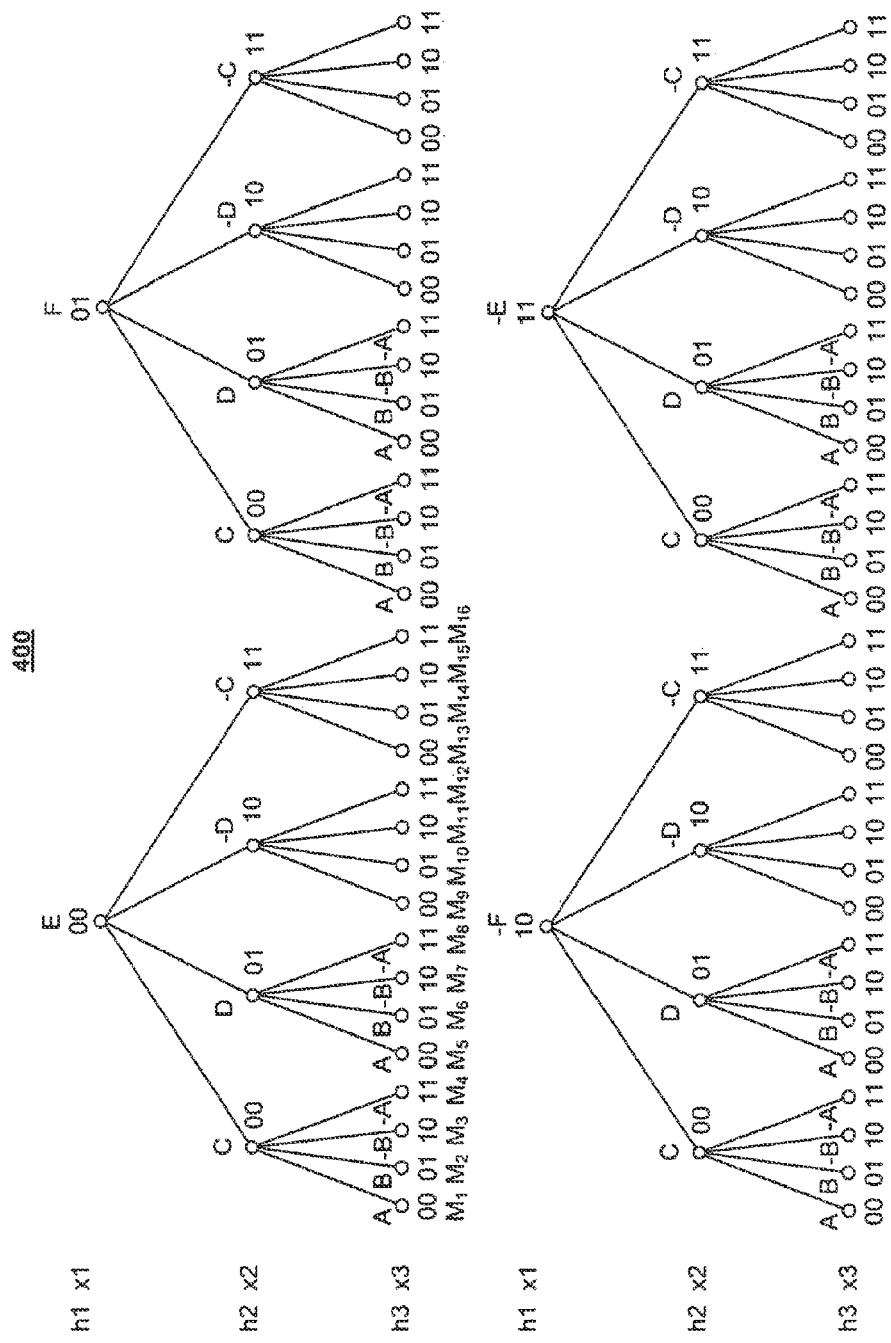
FIG. 4 is an illustrative diagram of metric state computation trees in accordance with an embodiment of the present invention.

Metric logic circuitry 320 provides the computed metric state values M to state update circuitry 330 via communications link 322. State update circuitry 330 compares M values that correspond to particular bit positions of the various signal streams to determine which of the M values associated with that bit position is the minimum value. State update circuitry 330 then sets the state value (i.e., S1, S2, . . . , or S12) to be the minimum computed value among the M values. For example, to find the minimum M value for state S10, state update circuitry 330 finds the minimum value among $M_3$, $M_4$, $M_7$, $M_8$, $M_{10}$, $M_{11}$, $M_{12}$, $M_{15}$, and $M_1$ for every permutation of $x_1$ because, for example, as shown in FIG. 4, those M values affect the bit position corresponding to S10 (i.e., where the first bit of $x_3$ is equal to '1'). Because it takes four clock cycles to compute all of the M values for each of the four permutations of $x_1$, the state update circuitry outputs the 12 state values in four clock cycles.

State update circuitry 330 provides the 12 computed state values to LLR computation circuitry 340 via communications link 332. LLR computation circuitry computes the LLR for each bit position based on the state values associated with that bit position. For example, LLR computation circuitry computes the $LLR_{21}$ (FIG. 2) (i.e., the second bit position of the second stream) by computing the difference between state values S7 and S8. LLR computation circuitry 340 provides the computed LLR values to processing circuitry 130 via communications link 122.

FIG. 4 is an illustrative diagram of metric state computation trees 400 in accordance with an embodiment of the present invention. Metric state computation trees 400 show all of the computations that are necessary to compute LLR values for each bit position of each stream of a received signal. Each sub-tree of metric state computation trees 400 corresponds to one permutation of $x_1$ and accordingly, since $x_1$ can be any one of four values, four different computation sub-trees are shown in trees 400. It is clear from seeing the various sub-trees, that each sub-tree can be computed independent of another sub-tree. Thus, the sub-trees, in one embodiment, may be computed in a pipeline which allows all of the M values associated with each sub-tree to be computed simultaneously in different pipeline clock cycles or stages and produce 64 M values in four clock cycles.

At each node or leaf of trees 400, for simplicity in referring to a particular permutation computation below, a label (i.e., a letter of the alphabet) represents one permutation of $x_1$, $x_2$, or $x_3$. For example, the label 'E' represents the permutation of $x_1$ being "00", the label "-E" represents the permutation of $x_1$ being "11", the label 'F' represents the permutation of $x_1$ being "01", and the label "–F" represents the permutation of $x_1$ being "10". Similarly, the label 'C' represents the permutation of $x_2$ being "00", the label "–C" represents the permutation of $x_2$ being "11", the label 'D' represents the permutation of $x_2$ being "01", and the label "–D" represents the permutation of $x_2$ being "10". Finally, the label 'A' represents the permutation of $x_3$ being "00", the label "–A" represents the permutation of $x_3$ being "11", the label 'B' represents the permutation of $x_3$ being "01", and the label "–B" represents the permutation of $x_3$ being "10". Accordingly, the computation of E+(–D)+(B) corresponds to the computation of $h_1*x_1+h_2*x_2+h_3*x_3$ for the permutations of $x_1$="00", $x_2$="10" and $x_3$="01".

The only dependencies that exist in the LLR computations are with respect to the minimum M value determinations. This is because each sub-tree produces 16 different M values corresponding to a different permutation of $x_1$ and those M values that affect a particular state (FIG. 2) need to be compared to one another. In particular, one sub-tree may produce M values which affect a particular state that is also affected by an M value produced by one of the other sub-trees. Accordingly, the minimum M value computations (i.e., state update computations) require four clock cycles (one clock cycle for each set of M values of a particular sub-tree) in order to compare all of the M values from each sub-tree that affect a particular state.

For example, the first tree corresponds to the permutation of $x_1$ being equal to "00" labeled as E. At the lowest level of the first tree are 16 leaves that each correspond to a different M value of that $x_1$ permutation. In particular, the computation associated with the permutation of $x_1$ being "00", $x_2$ being "01" (labeled as D) and $x_3$ being "00" (labeled as A) results in the $M_5$ value. Accordingly, it can be seen that each tree provides a different set of 16 M values that each correspond to a different permutation of $x_1$ (that is combined with all permutations of $x_2$ and $x_3$) and thereby 64 M values are provided in total which are necessary for computing the LLR values for each bit position of the three received y streams.

With reference to computation trees 400, metric state portion computation circuitry 310, computes one of the four trees. In particular, metric state portion computation circuitry 310 can compute $h_1x_1+h_2x_2+h_3x_3$ for every permutation of $x_2$ and $x_3$ and one permutation of $x_1$ (i.e., E+(C–A), E+(C+B), E+(C+(–B)), E+(C+(–A)), E+(D+A), . . . , E+(–C+(–A))). This produces the 16 M values that correspond to the E permutation of $x_1$.

Computation trees 400 also provide information as to which states a particular M value affects. State update circuitry 330 uses this information to determine which M values need to be compared with each other to find a minimum M value for a particular state. In particular, when computing the minimum M values that correspond to a particular state, it is necessary to exclude M values which do not have an effect on that state. Thus, as shown in the first computation tree 400 (i.e., the tree associated with the value E), $M_1$ affects states S9 and S11 because A (which is a leaf associated with $M_1$) corresponds the value "00" of the stream 3 and as shown in FIG. 2, S9 corresponds to stream 3, bit position 0 being equal to '0' and S11 corresponds to stream 3, bit position 1 being equal to '0'. Similarly, $M_1$ also affects states S5 and S7 because C (which is a node associated with $M_1$) corresponds the value "00" of the stream 2 and as shown in FIG. 2, S5 corresponds to stream 2, bit position 0 being equal to '0' and S7 corresponds to stream 3, bit position 1 being equal to '0'. Finally, it can be determined that $M_1$ also affects states S1 and S3 since those states are associated with E which corresponds to the value "00" of stream 1. Thus, $M_1$ affects states S1, S3, S5, S7, S9 and S11.

One can similarly determine which other M values of all the other sub-trees affect the states which $M_1$ corresponding to the E sub-tree affects (i.e., states S1, S3, S5, S7, S9 and S11). For example, among other M values, S5 is affected by $M_{1-8}$ and S7 is affected by $M_{1-4}$ and $M_{9-12}$. Thus, when computing the minimum M value for state S5, $M_{1-8}$ have to be compared to one another to find the minimum among them and when computing the minimum M value for state S7, $M_{1-4}$ and $M_{9-12}$ have to be compared to one another to find the minimum among them.

Figure 5:
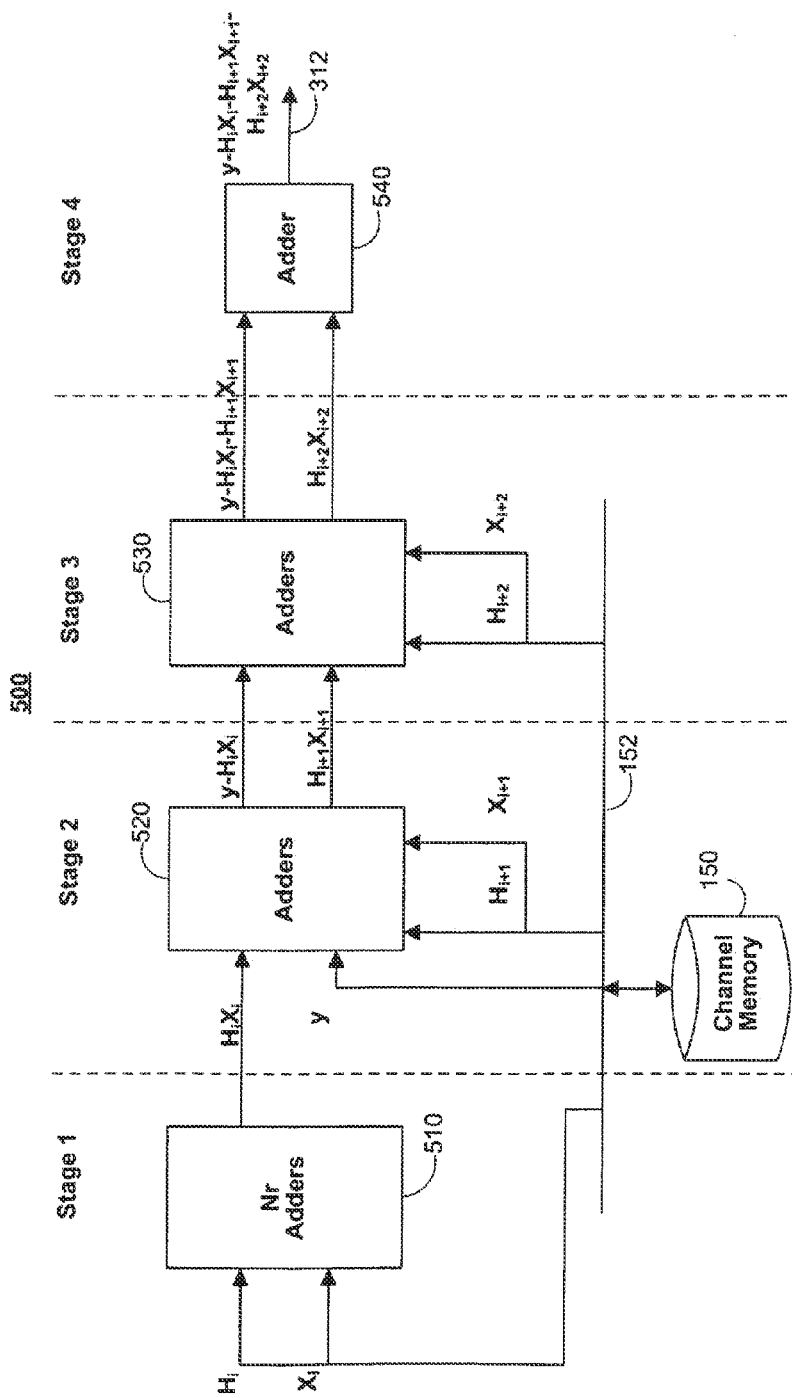
FIG. 5 is a detailed illustration of metric state portion computation circuitry in accordance with an embodiment of the present invention.

FIG. 5 shows one implementation of metric state portion computation circuitry 310 (FIG. 3). In particular, metric state portion circuitry 500 (FIG. 5) includes several complex adders 510, 520, 530 and 540. Metric state portion circuitry 500 computes in four stages (i.e., four pipeline clock cycles) one sub-tree of trees 400. For example, metric state portion circuitry 500 can compute the sub-tree corresponding to the one permutation of $x_1$ being equal to "00" and all permutations of $x_2$ and $x_3$ in four clock cycles. Metric state portion circuitry 500 begins computing different sub-trees at each stage of the four stages to allow simultaneous computation of the various sub-trees. It should be understood, that once all four sub-trees corresponding to one tone of the received signal have been computed, metric state portion computation circuitry 500 may begin computing the four sub-trees corresponding to another tone of a received signal. Thus, multiple tones of different signals may be computed in the decoder pipeline 120 simultaneously.

FIG. 11 is a detailed illustration of LLR computation pipeline stages 1100 in accordance with an embodiment of the present invention. In particular, FIG. 11 shows the pipelined computations associated with the sub-tree of trees 400 (FIG. 4) corresponding to one permutation of $x_1$ being equal to "00". Metric state portion circuitry 500 computes the values shown in computation pipeline stages 1100 associated with Times 1-4.

Referring back to FIG. 5, stage 1 of metric state portion circuitry 500 computes every permutation of stream $x_i$ multiplied by the channel response associated with stream i. For example, in stage 1 (i.e., a first clock cycle), complex adder 510 retrieves from channel memory 150 (or receives from receiver 110 (FIG. 1) the channel response $h_3$ (associated with stream 1) and computes all permutations of $h_3$ and $x_3$ to output $h_3*x_3$. In particular, $x_i$ corresponds to all permutations of one of the received streams $y_i$ and thus can be equal to one of four values (i.e., (0,0), (1,0), (0,1), (1,1)). Accordingly, the output of complex adder 510 is $h_3$ multiplied by each of those four possibilities or permutations. These computations correspond to the values at the leaves of each sub-tree of trees 400 (FIG. 4) (i.e., the A, –A, B, and –B values).

It should be understood that $x_3$ need not be received by complex adder 510 since every possibility of $x_3$ can be generated by complex adder 510 and multiplied by $h_3$. However, in some embodiments, channel memory 150 may store every permutation of $x_1$, $x_2$, and $x_3$ and thus provide the necessary values to complex adders 510, 520, 530 or 540. In some other embodiments, receiver 110 (FIG. 1) may generate every permutation of $x_1$, $x_2$, and $x_3$ and thus provide the necessary values directly to metric state portion circuitry 500.

Stage 2 of metric state portion circuitry 500 computes using complex adder 520 every permutation of stream $x_{i+1}$ multiplied by the channel response associated with stream i+1. These computations may be performed in a similar fashion as those associated with the $h_3*x_3$ computation. These computations correspond to the values at the second level nodes of each sub-tree shown in trees 400 (FIG. 4) (i.e., the C, −C, D, and −D values).

Complex adder 520 also retrieves from channel memory 150 (FIG. 1) or receives from receiver 110 the values corresponding to the three streams of the received signal $y_z$ where z represents one of the three received signal streams for which the metric is being computed. In particular, complex adder 520 computes $y_z-h_3^*x_3$ (i.e., $y_1-h_3^*x_3$, $y_2-h_3^*x_3$ and $y_3-h_3^*x_3$) in parallel at the same time (i.e., in the same stage) as it computes $h_2^*x_2$ ($h_{i+1}^*x_{i+1}$).

Stage 3 of metric state portion circuitry 500 computes using complex adder 530 one permutation of stream $x_{i+2}$ multiplied by the channel response associated with stream i+2. This computation correspond to the values at the first level of one sub-tree shown in trees 400 (FIG. 4) (i.e., the E, −E, F, or −F values). Every pipeline clock cycle after computing the values at the first level of one sub-tree, complex adder 520 computes the values at the first level of one of the other sub-trees. Thus, after four clock cycles, all the values of each the sub-tree are computed and can be used to compute the M values.

Complex adder 520 also computes the portion of metric corresponding to $y-h_3^*x_3-h_2^*x_2$ by subtracting the values it receives from complex adder 520. In particular, complex adder 520 computes $y_1-h_3^*x_3-h_2^*x_2$, $y_2-h_3^*x_3-h_2^*x_2$ and $y_3-h_3^*x_3-h_2^*x_2$ in parallel at the same time (i.e., in the same stage) as it computes the one permutation of $(h_1^*x_1)$, where the i represents the permutation of $x_1$.

Stage 4 of metric state portion circuitry 500 computes using complex adder 540 the $u_z$ values by subtracting the values it receives from complex adder 530 where z represents one of the three received signal streams for which the metric is being computed. In particular, complex adder 540 computes $u_1=y_1-h_3^*x_3-h_2^*x_2-(h_1^*x_1)_i$, $u_2=y_2-h_3^*x_3-h_2^*x_2-(h_1^*x_1)_i$ and $u_3=y_3-h_3^*x_3-h_2^*x_2-(h_1^*x_1)_i$.

The next step necessary to compute the metric is to compute the absolute values of $u_z$. Then, each of the absolute values of $u_z$ associated with the particular permutation of $x_1$ have to be summed to obtain the M values for the particular sub-tree. Metric logic circuitry 320 (FIG. 3) performs these computations.

Figure 6:
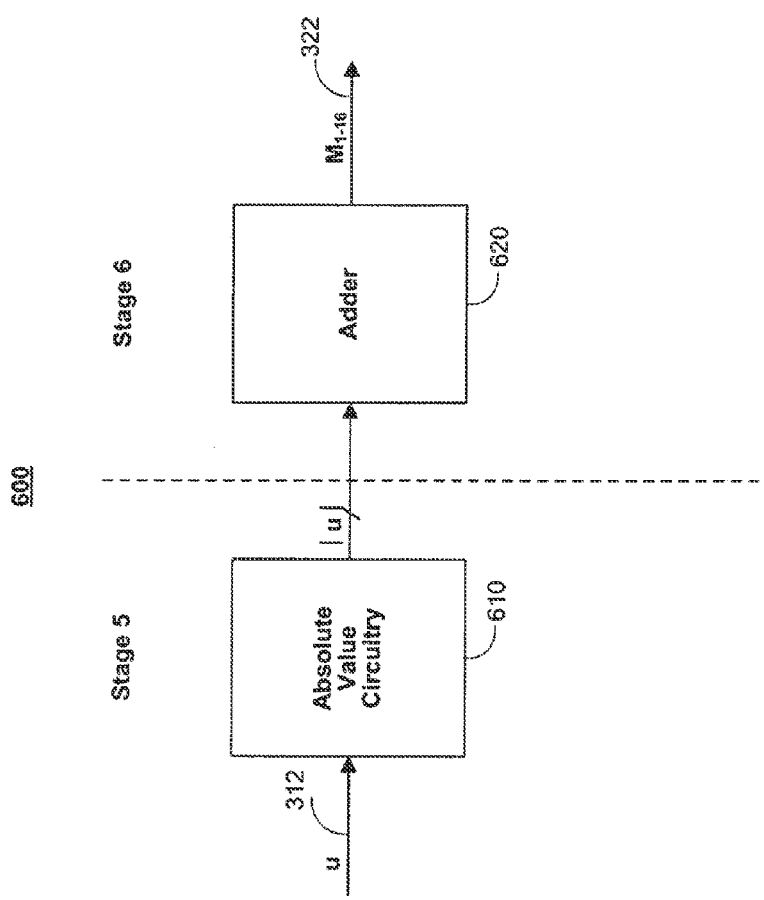
FIG. 6 is a detailed illustration of metric state computation circuitry in accordance with an embodiment of the present invention.

FIG. 6 shows one implementation of metric logic circuitry 320 (FIG. 3). In particular, metric logic circuitry 600 includes absolute value circuitry 610 and a complex adder 620. Metric logic circuitry 600 implements LLR computation pipeline stages 1100 (FIG. 11) associated with times 5 and 6.

For example, in a one stage, which is stage 5 of ML decoder pipeline 120 (FIG. 1), absolute value circuitry 610 receives the $u_z$ values 312 from metric state portion computation circuitry 310 and computes the absolute value of $u_z$. In another stage, which is stage 6 of ML decoder pipeline 120, complex adder 620 sums all of the $|u_z|$ to produce 16 M values (i.e., $M_{1-16}$). In particular, each M value that is produced corresponds to a different combination of E+(C, −C, D, or −D)+(A, −A, B, or −B).

At each clock cycle, 16 different M values are produced where each set corresponds to a different permutation of $x_1$ or a different sub-tree of trees 400 (FIG. 4). Thus, at the end of four clock cycles, metric logic circuitry 600 produces M values corresponding to different combinations of E+(C, −C, D, or −D)+(A, −A, B, or −B), −E+(C, −C, D, or −D)+(A, −A, B, or −B), F+(C, −C, D, or −D)+(A, −A, B, or −B), and −F+(C, −C, D, or −D)+(A, −A, B, or −B).

After the M values are computed for one of the trees 400, the M values that affect a particular state are compared by state update circuitry 330 to find the minimum M value and store that value as the value for the affected state.

Figure 7:
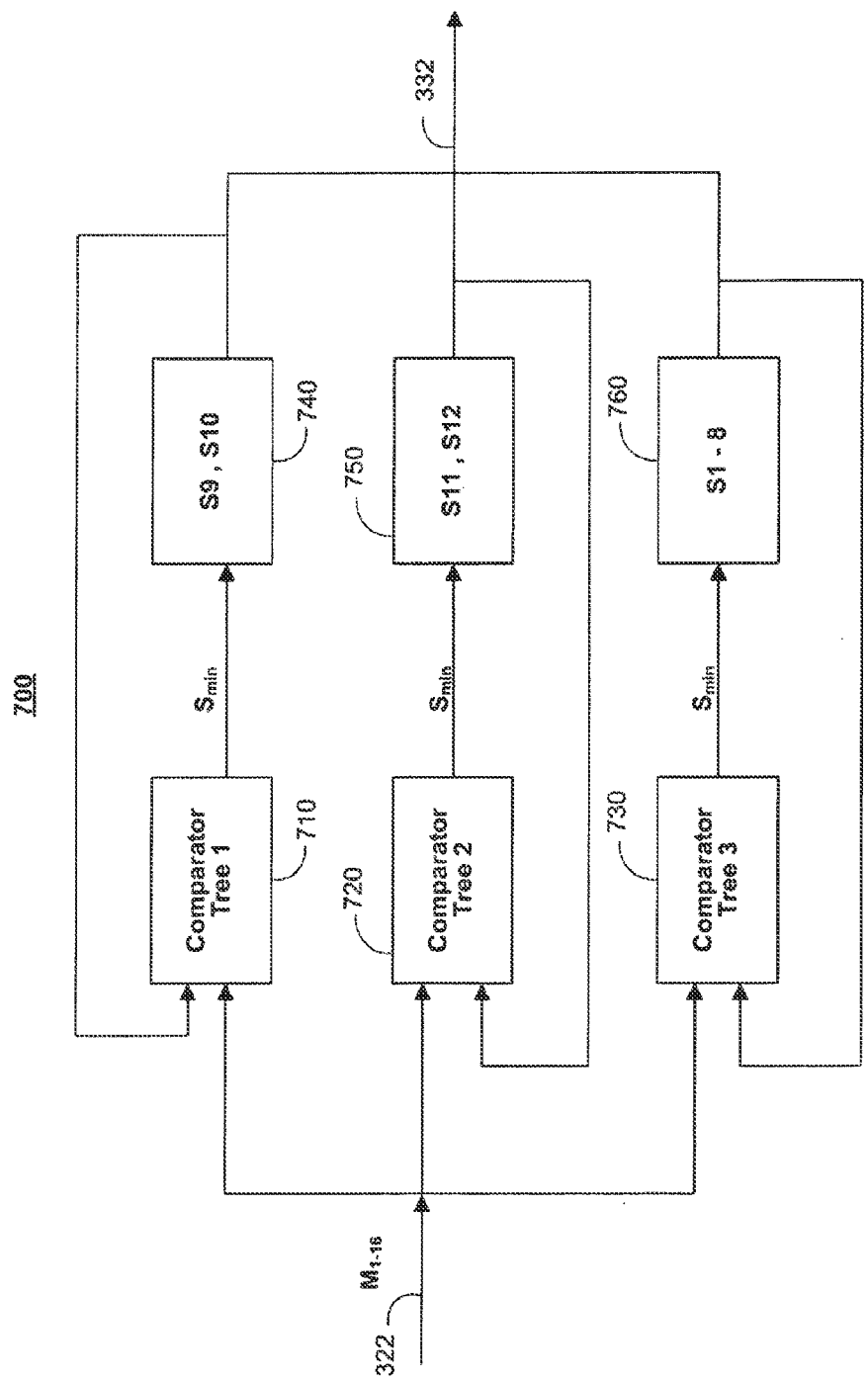
FIG. 7 is a detailed illustration of metric state update circuitry in accordance with an embodiment of the present invention.

FIG. 7 shows one implementation of state update circuitry 330 (FIG. 3). In particular, state update circuitry 700 includes a first comparator tree 710, a second comparator tree 720, a third comparator tree 730, and state storage devices 740, 750 and 760. State update circuitry 700 implements LLR computation pipeline stages 1100 (FIG. 11) associated with times 7-10.

Each comparator tree 710, 720 and 730 receives the M values 322 computed by metric logic circuitry 320 (FIG. 3). First comparator tree 710 includes comparison circuitry that compares the M values that affect states S9 and S10. As discussed above in connection with trees 400 (FIG. 4), for example, state S9 is affected by $M_1$, $M_2$, $M_5$, $M_5$, $M_9$, $M_{10}$, $M_{13}$, and $M_{14}$. Accordingly, first comparator tree 710 includes circuitry that finds the minimum among $M_1$, $M_2$, $M_5$, $M_5$, $M_9$, $M_{10}$, $M_{13}$, and $M_{14}$. First comparator tree 710 compares that minimum value that affects state S9 and with a previously stored minimum value for state S9 (received from storage device 740) and finds the minimum among those values. In particular, because each sub-tree of trees 400 includes M values that may affect some of the states S1-S12, each comparator tree 710, 720 and 730 has to compare a previously stored minimum value for the state with newly computed values (i.e., the M values associated with a particular sub-tree received at every clock cycle) associated with that state. First comparator tree 710 then stores that minimum value in a location on storage device 740 that corresponds to S9.

Figure 8:
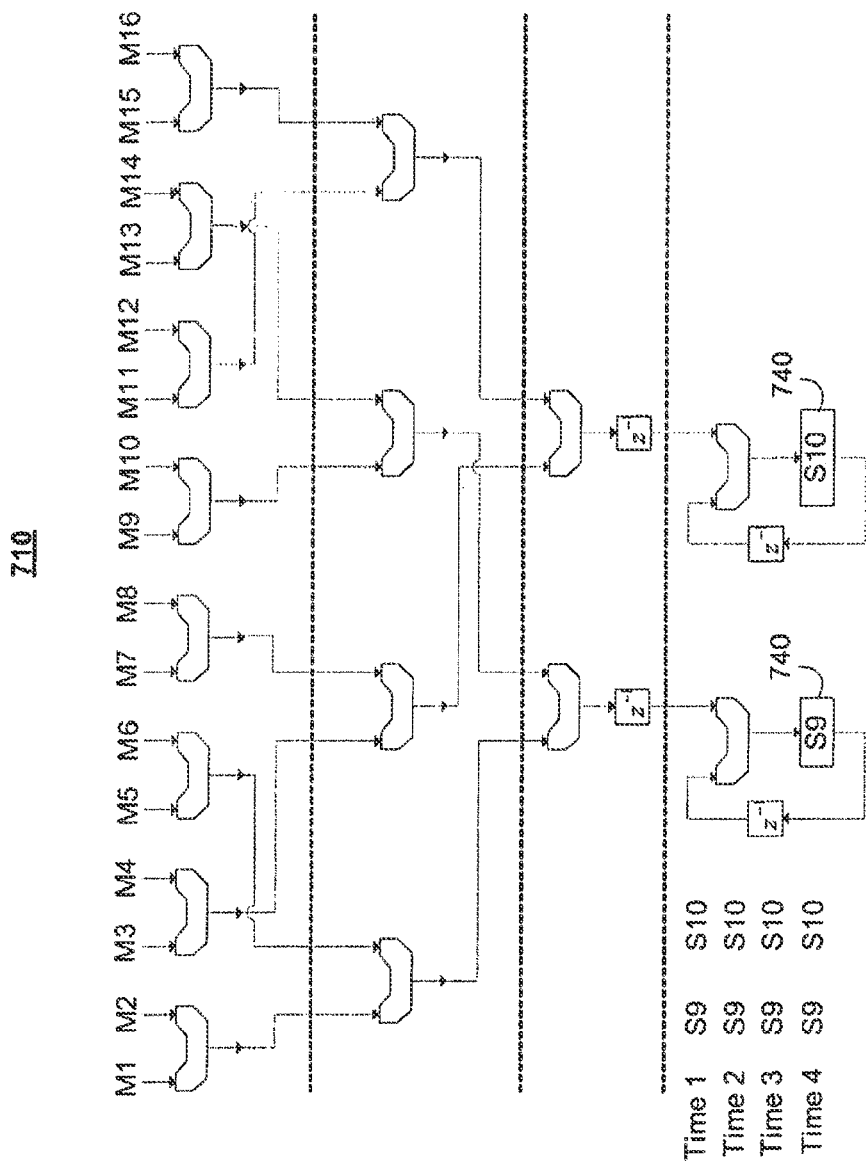
FIGS. 8-10 are detailed illustrations of metric state update comparator trees in accordance with an embodiment of the present invention.

FIG. 8 is an exemplary implementation of first comparator tree 710. In particular, as shown in FIG. 8, first comparator tree 710 may include multiple comparators arranged in a tournament tree fashion to find a particular minimum M value for states S9 or S10 among a number of M values that affect those respective states.

Second and third comparator trees 720 and 730 operate in a similar manner as first comparator tree 710 to produce minimum state values. In particular, second comparator tree 720 receives 16 M values 322 and compares the M values that affect states S11 and S12 to find the minimum among them. Also, second comparator tree 720 receives a previously stored minimum value for S11 and S12 from storage device 750 and compares those values to the newly computed minimum values to find the minimum among them. Second comparator tree 720 outputs and stores the minimum state S11 and S12 values as the new minimum values for those states in storage device 750.

Figure 9:
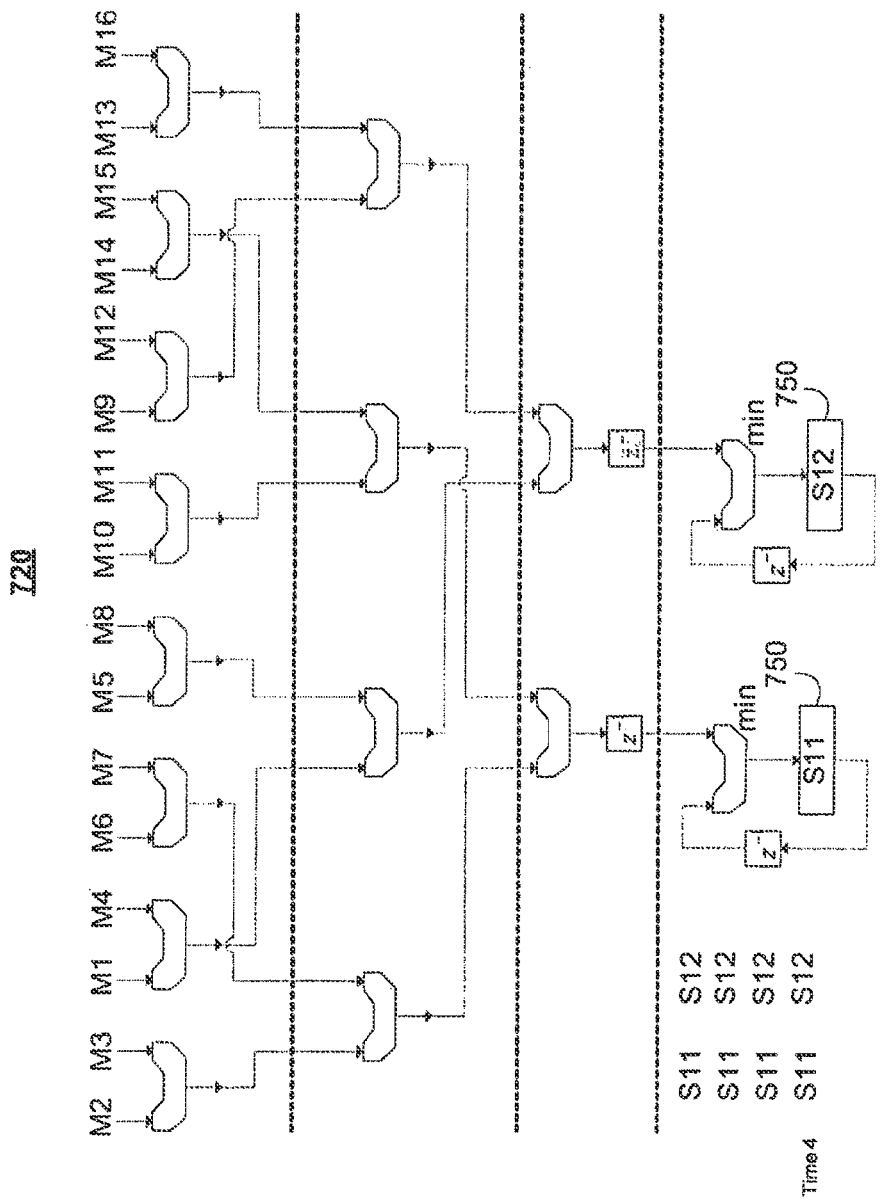

FIG. 9 is an exemplary implementation of second comparator tree 720. In particular, as shown in FIG. 9, second comparator tree 720 may include multiple comparators arranged in a tournament tree fashion to find a particular minimum M value for states S11 or S12 among a number of M values that affect those respective states.

Third comparator tree 730 receives 16 M values 322 and compares the M values that affect states S1-S8 to find the minimum among them. Also, third comparator tree 730 receives a previously stored minimum value for S1-8 from storage device 760 and compares those values to the newly computed minimum values to find the minimum among them. Third comparator tree 730 outputs and stores the minimum state S1-8 values as the new minimum values for those states in storage device 760.

Figure 10:
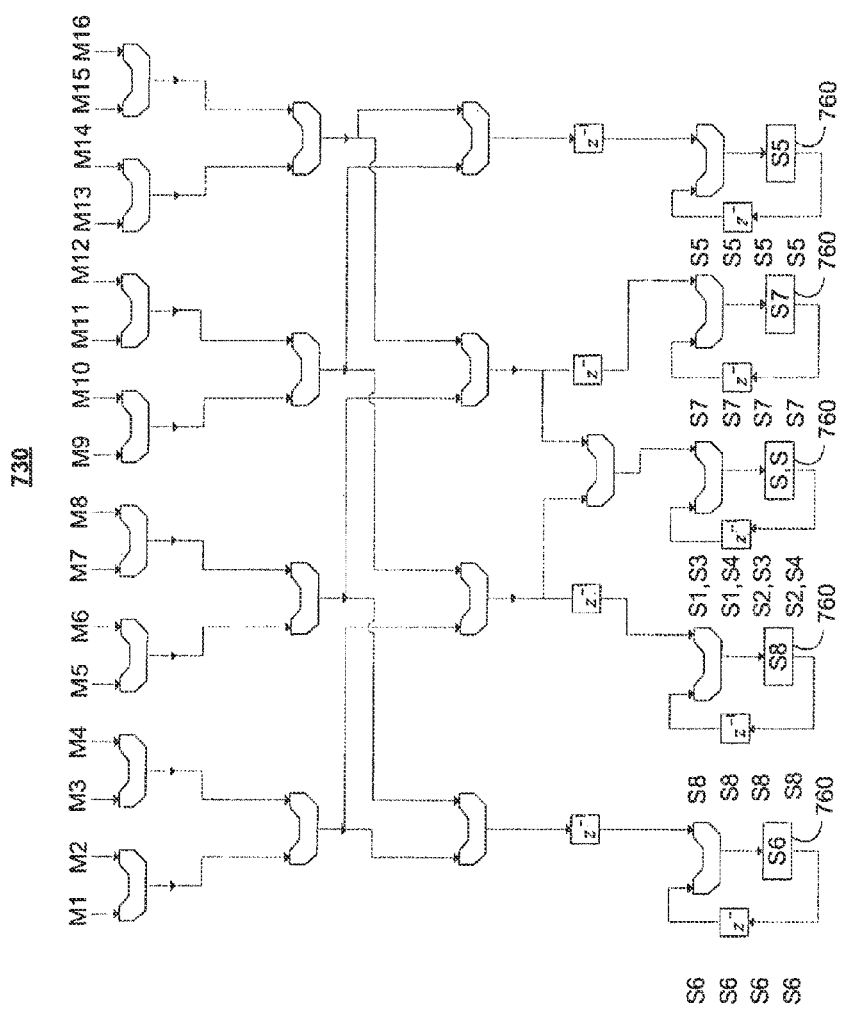

FIG. 10 is an exemplary implementation of third comparator tree 730. In particular, as shown in FIG. 9, third comparator tree 730 may include multiple comparators arranged in a tournament tree fashion to find a particular minimum M value for states S1-8 among a number of M values that affect those respective states.

At the end of four clock cycles, when all of the M values from each of the trees 400 have been computed and compared, the state storage devices 740, 750 and 760 store the minimum M values among all of the trees 400 that affect the respective state.

In another embodiment, at each clock cycle of the pipeline a different stream of received signal y is used in computing the metric or M values. FIG. 12 is a detailed illustration of an ML decoding pipeline 1200 in accordance with this embodiment of the present invention. In particular, ML decoding pipeline 1200 is an alternate implementation for ML decoder pipeline 120 (FIG. 1).

ML decoding pipeline 1200 includes adder circuitry 1210, adder/absolute value circuitry 1220a-d, accumulator/minimum S value circuitry 1230a-d, and LLR circuitry 1240. Adder circuitry 1210 is an implementation of metric state portion computation circuitry 310 (FIG. 1). Adder circuitry 1210 computes $y-h_0*x_0$, $h_1*x_1$, and $h_2*x_2$ for every stream of the received signal, one stream per clock cycle. In particular, during the first clock cycle, adder circuitry 1210 computes $y_0-h_{0,0}*x_0$, $h_{0,1}*x_1$, and $h_{0,2}*x_2$; during the second clock cycle, adder circuitry 1210 computes $y_1-h_{1,0}*x_0$, $h_{1,1}*x_1$, and $h_{1,2}*x_2$; and during the third clock cycle, adder circuitry 1210 computes $y_2-h_{2,0}*x_0$, $h_{2,1}*x_1$, and $h_{2,2}*x_2$. Because each x can be one of four values, each of the computed portions is a different combination of the four values.

Adder circuitry 1210 then performs a subtraction of every permutation of two of the computed values in each subsequent clock cycle for each stream. For example, in the second clock cycle, adder circuitry 1210 computes $y_0-h_{0,0}*x_0-h_{0,1}*x_1$ for every permutation of $x_0$ and $x_1$ since the computation of $y_0-h_{0,0}x_0$ and $h_{0,1}*x_1$ is completed in the first clock cycle. Thus, at the end of three clock cycles, every permutation of the bottom two levels of each sub-tree of trees 400 is computed. What remains after the three clock cycles, is the combination of every permutation of the top levels of each sub-tree with the computed permutations of the bottom two levels. During each subsequent clock cycle (beginning in the third clock cycle) where different streams of the input signal are computed, the bottom two levels of one of the sub-trees (e.g., all the permutations of $y_0-h_{0,0}*x_0-h_{0,1}*x_1$) are provided to adder/absolute value circuitry 1220a to compute, for example, $y_0-h_{0,0}*x_0-h_{0,1}*x_1-h_{0,2}*x_2$ for one permutation of $x_2$. This results in computation of one complete sub-tree of trees 400 for one of the three streams in three clock cycles. Adder/absolute value circuitry 1220a also compute the absolute values of $y_0-h_{0,0}*x_0-h_{0,1}*x_1-h_{0,2}*x_2$ for the one permutation of $x_2$ and outputs $|y_0-h_{0,0}x_0-h_{0,1}*x_1-h_{0,2}*x_2|$ for that permutation of $x_2$ to accumulator/minimum S value circuitry 1230a.

Each adder/absolute value circuitry 1220b-d operates in a similar manner as adder/absolute value circuitry 1220a but computes $|y_0-h_{0,0}*x_0-h_{0,1}*x_1-h_{0,2}*x_2|$ for different permutations of $x_2$. Thus, each adder/absolute value circuitry 1220a-d outputs 16 M values corresponding to a particular permutation of $x_2$ and every permutation of $x_0$ and $x_1$ at each clock cycle. However, each set of 16 M values corresponds to a different stream of the input signal y. Therefore, each adder/absolute value circuitry 1220a-d takes three clock cycles to compute all of the 16 M values associated with that particular permutation of $x_2$ for every one of the three streams of the received signal y. Adder/absolute value circuitry 1220a-d thus is one implementation of metric logic circuitry 320 (FIG. 3) which provides the various M values to state update circuitry 330.

Accumulator/minimum S value circuitry 1230a-d, at each clock cycle, accumulate the received M values associated with one stream with those associated with another stream of the received signal and compute the minimum values of the accumulated M values that affect a particular state. For example, as discussed above, state S7 is affected by $M_{1-4}$ and $M_{9-12}$ and thus, accumulator/minimum S value circuitry 1230a will compute the minimum among those M values for state S7. The states that are affected by the M values can be determined from trees 400 (FIG. 4). Accumulator/minimum S value circuitry 1230a-d thus are one implementation of state update circuitry 330 (FIG. 3).

Each accumulator/minimum S value circuitry 1230b-d operates in a similar manner as accumulator/minimum S value circuitry 1230a to accumulate and compute the minimum M values that are associated with a different permutation of $x_2$ and that affect a particular state value. Additionally, each accumulator/minimum S value circuitry 1230b-d compares the computed minimum S value that it computes with one that a previous accumulator/minimum S value circuitry 1230b-d computes. This is necessary to find the minimum M values that are associated with each permutation of $x_2$. For example, accumulator/minimum S value circuitry 1230b computes the minimum value among the M values that affect state S5 that are received from adder/absolute value circuitry 1220b (e.g., permutation of $x_2$="01") and compares those values with the minimum compute value for state S5 received from accumulator/minimum S value circuitry 1230a to find and set state S5 to be the minimum among all those values.

The last accumulator/minimum S value circuitry 1230d computes the minimum S values among all of the permutations of $x_2$ and outputs each of those state values (S1-12) to LLR circuitry 1240. At the end of seven clock cycles, accumulator/minimum S circuitry 1230d completes computing the minimum state values for each of states S1-12 for one of the three streams of received signal y.

LLR circuitry 1240 operates in a similar manner as LLR computation circuitry 340 and computes the LLR values for each bit position of the received signal based on the minimum state values S1-12 that are computed by accumulator/minimum S circuitry 1230d.

Figure 13:
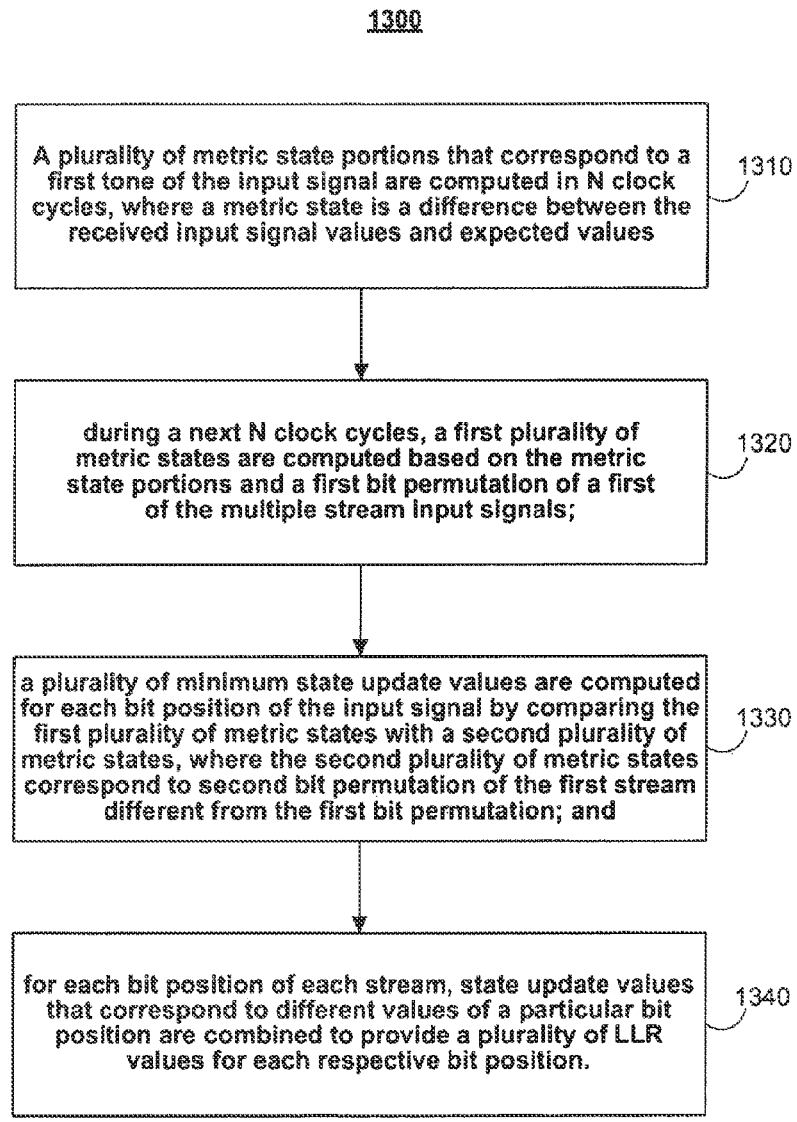
FIG. 13 illustrates a process performed by ML decoding pipeline in accordance with an embodiment of the present invention.

FIG. 13 illustrates a process 1300 performed by ML decoding pipeline in accordance with an embodiment of the present invention. At step 1310 a plurality of metric state portions that correspond to a first tone of the input signal are computed in N clock cycles, where a metric state is a difference between the received input signal values and expected values. For example, as shown in connection with FIGS. 3 and 5, metric state portion computation circuitry 310 and 500, receive and compute, in four clock cycles, for at least one of the streams of one tone of received signal y and channel response H, $u=y-H_1*x_1-H_2*x_2-H_3*x_3$ for every permutation of $x_2$, $x_3$ and one permutation of $x_1$. In particular, the lower two levels of at least one of trees 400 are computed by metric state portion computation circuitry 310. Also as shown in connection with FIG. 12, adder circuitry 1210 receives and computes for at least one of the streams of one tone of received signal y and channel response H, $y-H_1*x_1-H_2*x_2$ and $H_3*x_3$. A first part of adder/absolute value circuitry 1220a-d computes $u=y-H_1*x_1-H_2*x_2-H_3*x_3$ for every permutation of $x_0$, $x_1$ and one permutation of $x_2$ thus producing the lower two levels of at least one of trees 400 corresponding to a first one of the received streams every clock cycle.

At step 1320 during the next N clock cycles, a first plurality of metric states are computed based on the metric state portions and the first bit permutation of the first of the multiple stream input signals. For example, metric logic circuitry 320 and 600, receive and compute, in two clock cycles or stages, for at least one of the streams of one tone of received signal y, |u| for every permutation of $x_2$, $x_3$ and one permutation of $x_1$ and accumulate the |u| associated with each stream of received signal y which produce 16 metric state values (M) corresponding to that permutation of $x_1$ (FIGS. 3 and 6). Also as shown in connection with FIG. 12, adder/absolute value circuitry 1220*a-d* compute for at least one of the streams of one tone of received signal y, 16 metric state values (M) corresponding to one permutation of $x_2$ (FIGS. 3 and 6).

At step 1340, a plurality of minimum state update values are computed for each bit position of the input signal by comparing the first plurality of metric states with a second plurality of metric states, where the second plurality of metric states correspond to second bit permutation of the first stream different from the first bit permutation. For example, state update circuitry 330 and 700, receive the metric values (M) associated with one permutation of $x_1$ and compare the M values affecting a particular state to find the minimum among them (FIGS. 3 and 7-10). State update circuitry 330 and 700 then compare the computed minimum values of M with previously computed minimum values (which are associated with a different permutation of xJ of the affected state to find the minimum among them. Similarly, accumulator/minimum S value circuitry 1230*a-d* each compute the minimum state values from the received M values for a particular stream of the received signal and compare that minimum value with one computed by a previous accumulator/minimum S value circuitry 1230*a-d* (which is associated with a different permutation of $x_2$) to find the minimum value for that state (FIG. 12).

At step 1350, for each bit position of each stream, state update values that correspond to different values of a particular bit position are combined to provide a plurality of LLR values for each respective bit position. For example, as shown in connection with FIGS. 3 and 12, LLR computation circuitry 340 and 1240, receive the minimum state values for states S1-12 and compute the LLR for each bit position of the received signal streams. This is done by taking the difference between two state values that are associated with a particular bit position of a particular stream as shown in connection with FIG. 2.

Referring now to FIGS. 14A-14G, various exemplary implementations of the present invention are shown.

Figure 14A:
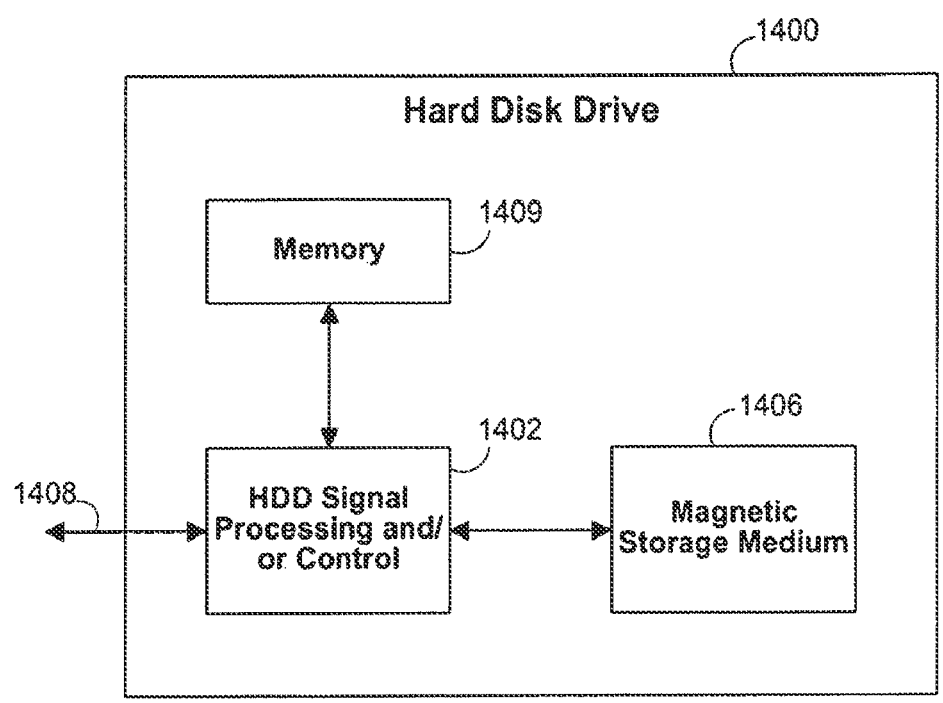
FIG. 14A is a block diagram of an exemplary hard disk drive that can employ the disclosed technology.

Referring now to FIG. 14A, the present invention can be implemented in a hard disk drive (HDD) 1400. The present invention may implement either or both signal processing and/or control circuits, which are generally identified in FIG. 14A at 1402. In some implementations, the signal processing and/or control circuit 1402 and/or other circuits (not shown) in the HDD 1400 may process data, perform coding and/or encryption, perform calculations, and/or format data that is output to and/or received from a magnetic storage medium 1406.

The HDD 1400 may communicate with a host device (not shown) such as a computer, mobile computing devices such as personal digital assistants, cellular phones, media or MP3 players and the like, and/or other devices via one or more wired or wireless communication links 1408. The HDD 1400 may be connected to memory 1409 such as random access memory (RAM), low latency nonvolatile memory such as flash memory, read only memory (ROM) and/or other suitable electronic data storage.

Figure 14B:
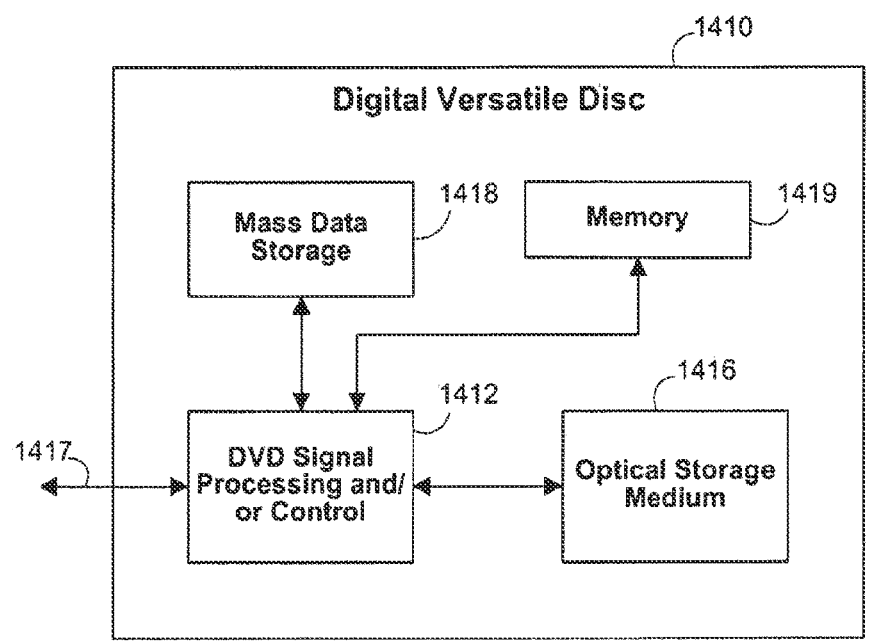
FIG. 14B is a block diagram of an exemplary digital versatile disc that can employ the disclosed technology.

Referring now to FIG. 14B, the present invention can be implemented in a digital versatile disc (DVD) drive 1410. The present invention may implement either or both signal processing and/or control circuits, which are generally identified in FIG. 14B at 1412, and/or mass data storage 1418 of the DVD drive 1410. The signal processing and/or control circuit 1412 and/or other circuits (not shown) in the DVD drive 1410 may process data, perform coding and/or encryption, perform calculations, and/or format data that is read from and/or data written to an optical storage medium 1416. In some implementations, the signal processing and/or control circuit 1412 and/or other circuits (not shown) in the DVD drive 1410 can also perform other functions such as encoding and/or decoding and/or any other signal processing functions associated with a DVD drive.

The DVD drive 1410 may communicate with an output device (not shown) such as a computer, television or other device via one or more wired or wireless communication links 1417. The DVD drive 1410 may communicate with mass data storage 1418 that stores data in a nonvolatile manner. The mass data storage 1418 may include a hard disk drive (HDD). The HDD 1400 may have the configuration shown in FIG. 14A. The HDD 1400 may be a mini HDD that includes one or more platters having a diameter that is smaller than approximately 1.8". The DVD drive 1410 may be connected to memory 1419 such as RAM, ROM, low latency nonvolatile memory such as flash memory and/or other suitable electronic data storage.

Figure 14C:
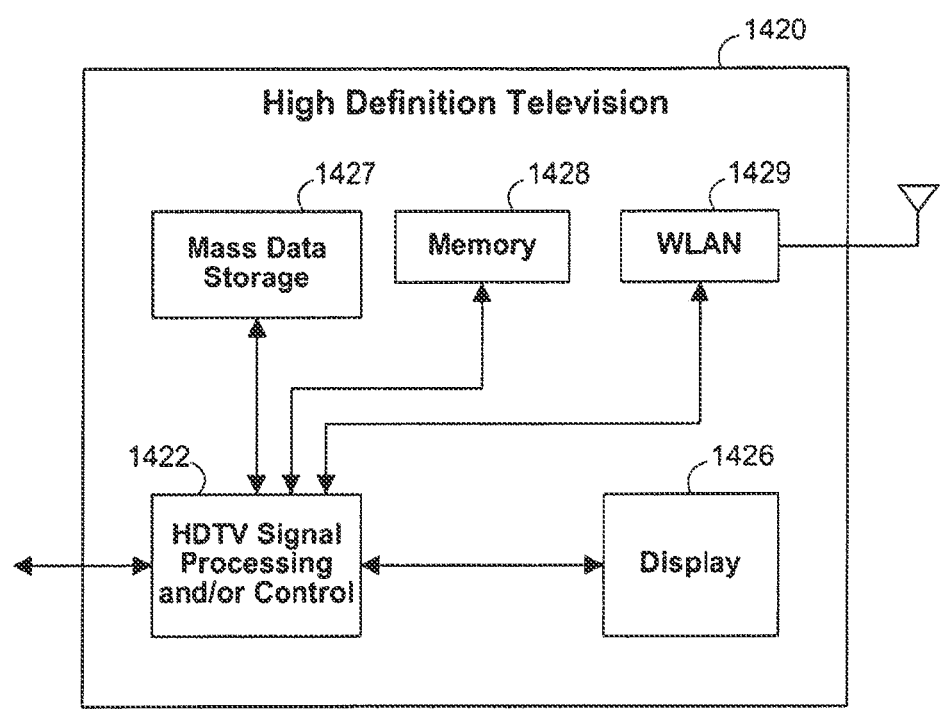
FIG. 14C is a block diagram of an exemplary high definition television that can employ the disclosed technology.

Referring now to FIG. 14C, the present invention can be implemented in a high definition television (HDTV) 1420. The present invention may implement either or both signal processing and/or control circuits, which are generally identified in FIG. 14C at 1422, a WLAN interface and/or mass data storage of the HDTV 1420. The HDTV 1420 receives HDTV input signals in either a wired or wireless format and generates HDTV output signals for a display 1426. In some implementations, signal processing circuit and/or control circuit 1422 and/or other circuits (not shown) of the HDTV 1420 may process data, perform coding and/or encryption, perform calculations, format data and/or perform any other type of HDTV processing that may be required.

The HDTV 1420 may communicate with mass data storage 1427 that stores data in a nonvolatile manner such as optical and/or magnetic storage devices for example hard disk drives and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". The HDTV 1420 may be connected to memory 1428 such as RAM, ROM, low latency nonvolatile memory such as flash memory and/or other suitable electronic data storage. The HDTV 1420 also may support connections with a WLAN via a WLAN interface 1429.

Figure 14D:
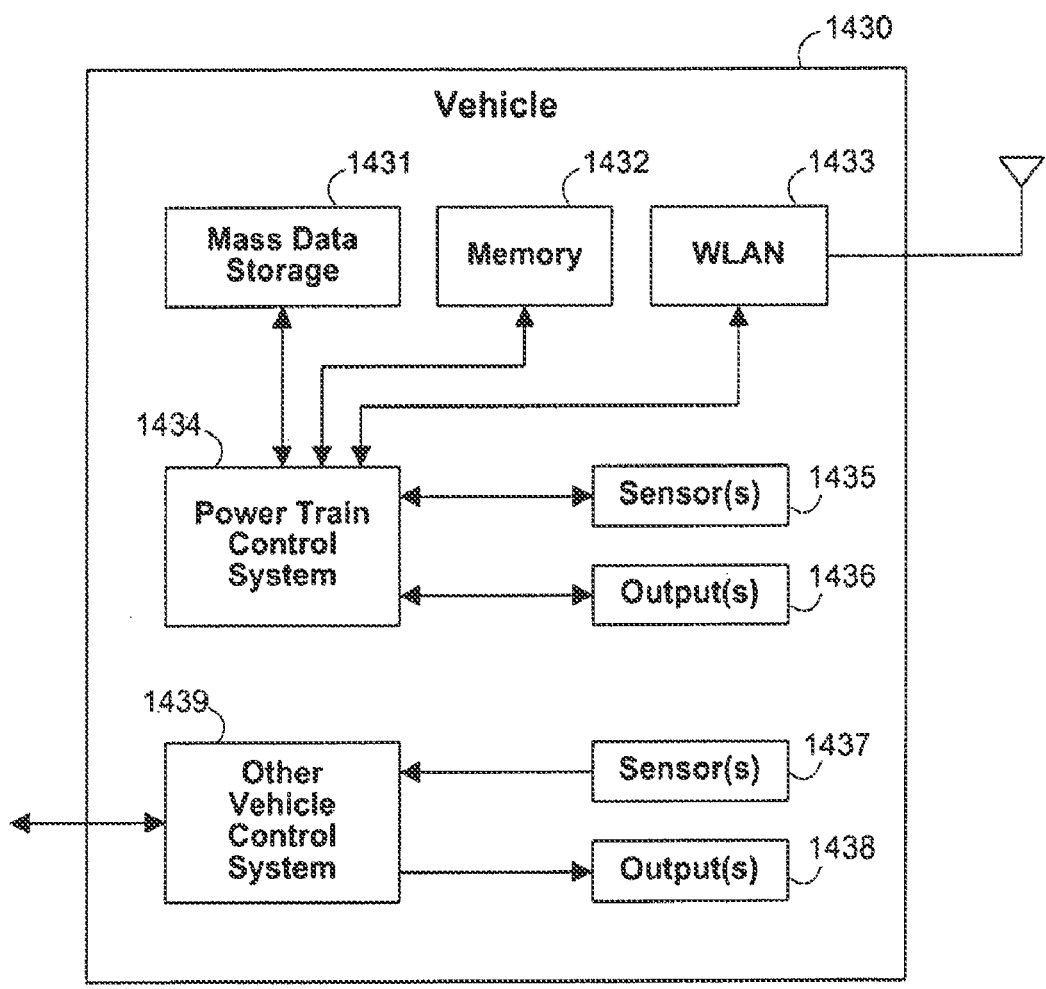
FIG. 14D is a block diagram of an exemplary vehicle that can employ the disclosed technology.

Referring now to FIG. 14D, the present invention implements a control system of a vehicle 1430, a WLAN interface and/or mass data storage of the vehicle control system. In some implementations, the present invention may implement a powertrain control system 1434 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 1439 of the vehicle 1430. The control system 1439 may likewise receive signals from input sensors 1437 and/or output control signals to one or more output devices 1438. In some implementations, the control system 1439 may be part of an anti-lock braking system (ABS), a navigation system, a telematics system, a vehicle telematics system, a lane departure system, an adaptive cruise control system, a vehicle entertainment system such as a stereo, DVD drive, compact disc drive and the like. Still other implementations are contemplated.

The powertrain control system 1434 may communicate with mass data storage 1431 that stores data in a nonvolatile manner. The mass data storage 1431 may include optical and/or magnetic storage devices for example hard disk drives and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". The powertrain control system 1434 may be connected to memory 1432 such as RAM, ROM, low latency nonvolatile memory such as flash memory and/or other suitable electronic data storage. The powertrain control system 1434 also may support connections with a WLAN via a WLAN interface 1433. The control system 1439 may also include mass data storage, memory and/or a WLAN interface (all not shown).

Figure 14E:
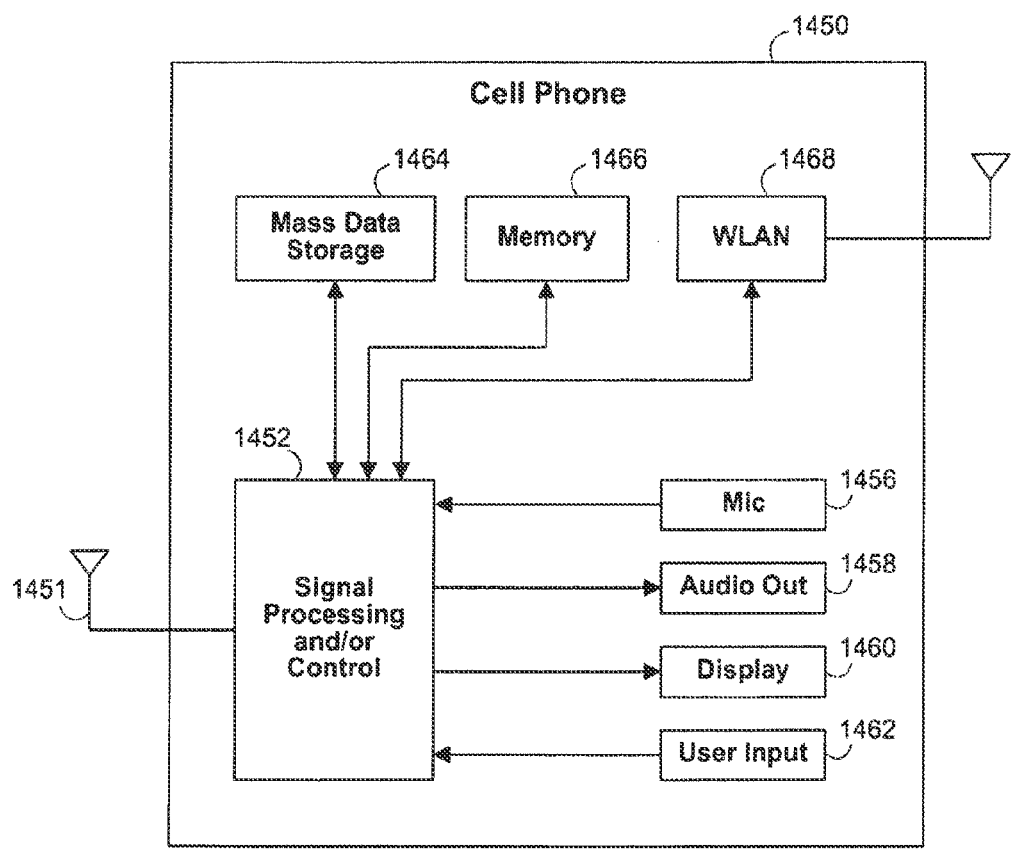
FIG. 14E is a block diagram of an exemplary cell phone that can employ the disclosed technology.

Referring now to FIG. 14E, the present invention can be implemented in a cellular phone 1450 that may include a cellular antenna 1451. The present invention may implement either or both signal processing and/or control circuits, which are generally identified in FIG. 14E at 1452, a WLAN interface and/or mass data storage of the cellular phone 1450. In some implementations, the cellular phone 1450 includes a microphone 1456, an audio output 1458 such as a speaker and/or audio output jack, a display 1460 and/or an input device 1462 such as a keypad, pointing device, voice actuation and/or other input device. The signal processing and/or control circuits 1452 and/or other circuits (not shown) in the cellular phone 1450 may process data, perform coding and/or encryption, perform calculations, format data and/or perform other cellular phone functions.

The cellular phone 1450 may communicate with mass data storage 1464 that stores data in a nonvolatile manner such as optical and/or magnetic storage devices for example hard disk drives and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". The cellular phone 1450 may be connected to memory 1466 such as RAM, ROM, low latency nonvolatile memory such as flash memory and/or other suitable electronic data storage. The cellular phone 1450 also may support connections with a WLAN via a WLAN interface 1468.

Figure 14F:
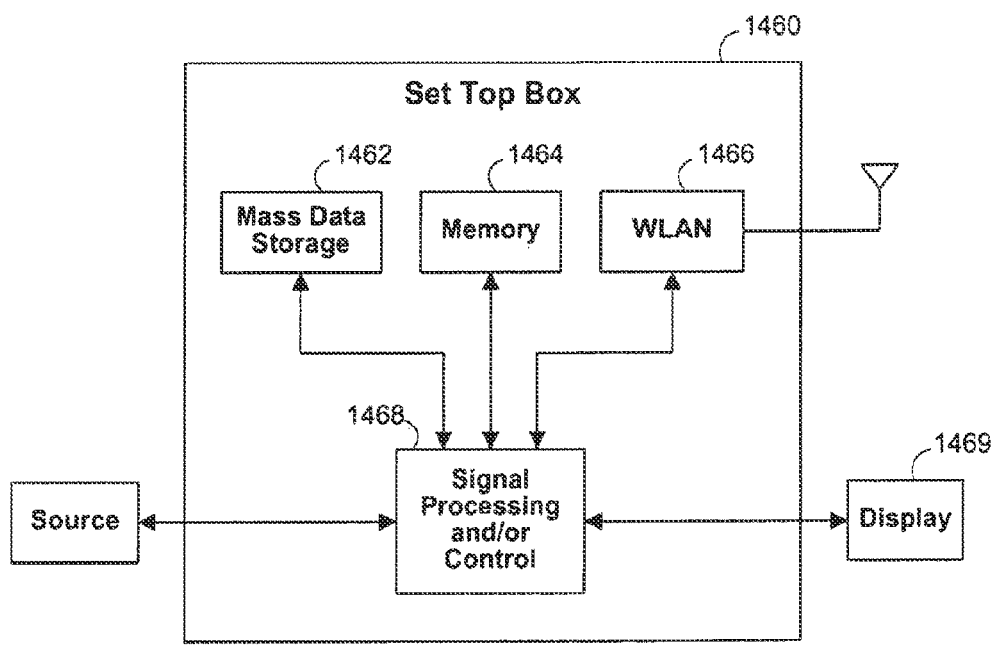
FIG. 14F is a block diagram of an exemplary set top box that can employ the disclosed technology.

Referring now to FIG. 14F, the present invention can be implemented in a set top box 1460. The present invention may implement either or both signal processing and/or control circuits, which are generally identified in FIG. 14F at 1468, a WLAN interface and/or mass data storage of the set top box 1460. The set top box 1460 receives signals from a source such as a broadband source and outputs standard and/or high definition audio/video signals suitable for a display 1469 such as a television and/or monitor and/or other video and/or audio output devices. The signal processing and/or control circuits 1468 and/or other circuits (not shown) of the set top box 1460 may process data, perform coding and/or encryption, perform calculations, format data and/or perform any other set top box function.

The set top box 1460 may communicate with mass data storage 1462 that stores data in a nonvolatile manner. The mass data storage 1462 may include optical and/or magnetic storage devices for example hard disk drives and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". The set top box 1460 may be connected to memory 1464 such as RAM, ROM, low latency nonvolatile memory such as flash memory and/or other suitable electronic data storage. The set top box 1460 also may support connections with a WLAN via a WLAN interface 1466.

Figure 14G:
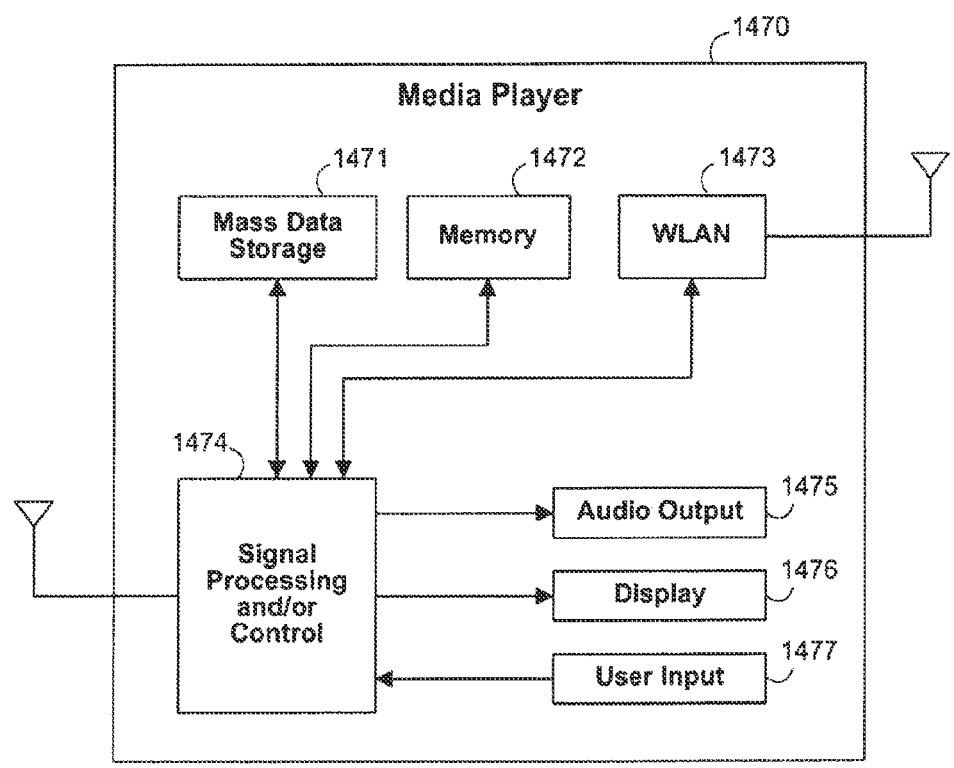
FIG. 14G is a block diagram of an exemplary media player that can employ the disclosed technology.

Referring now to FIG. 14G, the present invention can be implemented in a media player 1470. The present invention may implement either or both signal processing and/or control circuits, which are generally identified in FIG. 14G at 1474, a WLAN interface and/or mass data storage of the media player 1470. In some implementations, the media player 1470 includes a display 1476 and/or a user input 1477 such as a keypad, touchpad and the like. In some implementations, the media player 1470 may employ a graphical user interface (GUI) that typically employs menus, drop down menus, icons and/or a point-and-click interface via the display 1476 and/or user input 1477. The media player 1470 further includes an audio output 1475 such as a speaker and/or audio output jack. The signal processing and/or control circuits 1474 and/or other circuits (not shown) of the media player 1470 may process data, perform coding and/or encryption, perform calculations, format data and/or perform any other media player function.

The media player 1470 may communicate with mass data storage 1471 that stores data such as compressed audio and/or video content in a nonvolatile manner. In some implementations, the compressed audio files include files that are compliant with MP3 format or other suitable compressed audio and/or video formats. The mass data storage 1471 may include optical and/or magnetic storage devices for example hard disk drives and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". The media player 1470 may be connected to memory 1472 such as RAM, ROM, low latency nonvolatile memory such as flash memory and/or other suitable electronic data storage. The media player 1470 also may support connections with a WLAN via a WLAN interface 1473. Still other implementations in addition to those described above are contemplated.

The foregoing describes systems and methods providing a decoding pipeline for QPSK MIMO OFDM receivers. The above described embodiments of the present invention are presented for the purposes of illustration and not of limitation. Furthermore, the present invention is not limited to a particular implementation. The invention may be implemented in hardware, such as on an application specific integrated circuit (ASIC) or on a field-programmable gate array (FPGA). The invention may also be implemented in software.

What is claimed is:

1. A method for performing pipeline computation of a reliability value, the method comprising:
    computing, with control circuitry in a first pipeline stage, a reliability value portion based on a difference between a received input signal value and an expected value;
    combining, in a second pipeline stage that follows the first pipeline stage, the reliability value portion with a first value derived from the received input signal to generate a first reliability value; and
    determining whether to update the first reliability value in a third pipeline stage based on a combination of the first reliability value with a second reliability value that corresponds to a second value derived from the received input signal.

2. The method of claim 1, wherein the determining comprises computing a plurality of minimum state update values by comparing the first reliability value with the second reliability value, where the second value that is derived from the input signal corresponds to a second bit permutation of a stream of the input signal.

3. The method of claim 1, wherein the reliability value portion is computed based on all of the bit permutations of some streams of the input signal.

4. The method of claim 1, further comprising computing, for each bit position of the input signal, a difference between two state update values that correspond to different values of a particular bit position.

5. The method of claim 1, wherein the first pipeline stage is performed in N clock cycles and the second pipeline stage is performed during a next N clock cycles.

6. The method of claim 1, wherein first reliability value is updated at each clock cycle and wherein a plurality of reliability values are computed every four clock cycles.

7. The method of claim 1, wherein the combining comprises computing a first plurality of metric states based on the reliability value portion and a first bit permutation of the input signal.

8. The method of claim 1, wherein the reliability value portion corresponds to a first tone of the input signal.

9. The method of claim 1, wherein:
    the first reliability value is computed in accordance with:
    $$|u|=\Sigma|u_i|=\Sigma|y_i-H_i*x_i|$$
    where u is the first reliability value, $y_i$ is the input signal, i is a stream index to a stream of the input signal, H is the channel response, and x is an expected transmitted signal vector.

10. The method of claim 9, wherein the reliability value portion is computed in accordance with:
    $$y_i-H_i*z_i$$
    where z is a subset of some but not all of the vectors of x.

11. A system for performing pipeline computation of a reliability value, the system comprising:
    control circuitry configured to:
        compute, in a first pipeline stage, a reliability value portion based on a difference between a received input signal value and an expected value;
        combine, in a second pipeline stage that follows the first pipeline stage, the reliability value portion with a first value derived from the received input signal to generate a first reliability value; and
        determine whether to update the first reliability value in a third pipeline stage based on a combination of the first reliability value with a second reliability value that corresponds to a second value derived from the received input signal.

12. The system of claim 11, wherein the control circuitry is further configured to compute a plurality of minimum state update values by comparing the first reliability value with the second reliability value, where the second value that is derived from the input signal corresponds to a second bit permutation of a stream of the input signal.

13. The system of claim 11, wherein the reliability value portion is computed based on all of the bit permutations of some streams of the input signal.

14. The system of claim 11, wherein the control circuitry is further configured to compute, for each bit position of the input signal, a difference between two state update values that correspond to different values of a particular bit position.

15. The system of claim 11, wherein the first pipeline stage is performed in N clock cycles and the second pipeline stage is performed during a next N clock cycles.

16. The system of claim 11, wherein the first reliability value is updated at each clock cycle and wherein a plurality of reliability values are computed every four clock cycles.

17. The system of claim 11, wherein the control circuitry is further configured to compute a first plurality of metric states based on the reliability value portion and a first bit permutation of the input signal.

18. The system of claim 11, wherein the reliability value portion corresponds to a first tone of the input signal.

19. The system of claim 11, wherein:
    the first reliability value is computed in accordance with:
    $$|u|=\Sigma|u_i|=\Sigma|y_i-H_i*x_i|$$
    where u is the first reliability value, $y_i$ is the input signal, i is a stream index to a stream of the input signal, H is the channel response, and x is an expected transmitted signal vector.

20. The system of claim 19, wherein the reliability value portion is computed in accordance with:
    $$y_i-H_i*z_i$$
    where z is a subset of some but not all of the vectors of x.

* * * * *

UNITED STATES PATENT AND TRADEMARK OFFICE
CERTIFICATE OF CORRECTION

| | | |
|---|---|---|
| PATENT NO. | : 8,265,207 B1 | Page 1 of 1 |
| APPLICATION NO. | : 13/333106 | |
| DATED | : September 11, 2012 | |
| INVENTOR(S) | : Sarrigeorgidis et al. | |

It is certified that error appears in the above-identified patent and that said Letters Patent is hereby corrected as shown below:

On the Title Page, please insert

--Related U.S. Application Data
(63) Continuation of application No. 12/140,022, filed on June 16, 2008, now U.S. Pat. No. 8,098,774.

(60) Provisional application No. 60/944,245 filed on June 15, 2007, and Provisional application No. 60/975,639 filed on September 27, 2007.--

Signed and Sealed this
Sixth Day of November, 2012

David J. Kappos
*Director of the United States Patent and Trademark Office*